United States Patent
Chang et al.

[11] Patent Number: 6,084,301
[45] Date of Patent: *Jul. 4, 2000

[54] COMPOSITE BUMP STRUCTURES

[75] Inventors: Shyh-Ming Chang, Hsinchu; Yu-Chi Lee, Taipei Hsien; Jwo-Huei Jou, Hsinchu, all of Taiwan

[73] Assignee: Industrial Technology Industrial Research, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/950,376

[22] Filed: Oct. 14, 1997

Related U.S. Application Data

[60] Division of application No. 08/507,533, Jul. 26, 1995, Pat. No. 5,707,902, which is a continuation-in-part of application No. 08/387,095, Feb. 13, 1995, abandoned.

[51] Int. Cl.⁷ .......................... H01L 29/43; H01L 21/60; H01L 23/50
[52] U.S. Cl. .................. 257/737; 257/738; 257/778; 257/493; 257/729; 257/642; 257/643; 257/784; 257/786
[58] Field of Search .................. 257/737, 738, 257/734, 778, 693, 779–781, 690, 642, 643, 784, 786, 783

[56] References Cited

U.S. PATENT DOCUMENTS

| | | | |
|---|---|---|---|
| 3,401,126 | 9/1968 | Miller et al. | 252/514 |
| 3,809,625 | 5/1974 | Brown et al. | 204/15 |
| 4,504,007 | 3/1985 | Andersen, Jr. et al. | 228/123 |
| 4,749,120 | 6/1988 | Hatada | 228/123 |
| 4,883,744 | 11/1989 | Feilchenfeld et al. | 430/325 |
| 4,916,523 | 4/1990 | Sokolorsky et al. | 357/74 |
| 4,963,002 | 10/1990 | Tagusa | 350/336 |
| 5,034,345 | 7/1991 | Shirahata | 257/737 |
| 5,108,950 | 4/1992 | Wakabayashi et al. | 257/737 |
| 5,115,090 | 5/1992 | Sachder et al. | 528/353 |
| 5,134,460 | 7/1992 | Brady et al. | 357/71 |
| 5,272,111 | 12/1993 | Kosaki | 257/737 |
| 5,313,368 | 5/1994 | Volz et al. | 257/690 |
| 5,329,423 | 7/1994 | Scholz | 257/738 |
| 5,393,697 | 2/1995 | Chang et al. | 438/613 |
| 5,397,863 | 3/1995 | Ardakani et al. | 174/258 |
| 5,438,105 | 8/1995 | Nagata | 525/436 |
| 5,473,197 | 12/1995 | Idaka et al. | 257/737 |
| 5,477,087 | 12/1995 | Kawakita et al. | 257/737 |
| 5,578,527 | 11/1996 | Chang et al. | 156/273.9 |
| 5,631,499 | 5/1997 | Hosomi et al. | 257/737 |
| 5,668,410 | 9/1997 | Yamamoto | 257/737 |
| 5,744,557 | 4/1998 | McCormick et al. | 526/171 |
| 5,763,532 | 6/1998 | Harrington et al. | 525/194 |
| 5,766,808 | 6/1998 | Linde et al. | 430/15 |

FOREIGN PATENT DOCUMENTS

| | | | |
|---|---|---|---|
| 1-283843 | 11/1989 | Japan | 257/779 |
| 2-180036 | 7/1990 | Japan | 257/783 |

*Primary Examiner*—Alexander Oscar Williams
*Attorney, Agent, or Firm*—George O. Saile; Stephen B. Ackerman; Larry J. Prescott

[57] ABSTRACT

A composite bump structure and methods of forming the composite bump structure. The composite bump structure comprises a polymer body of relatively low Young's Modulus compared to metals covered by a conductive metal coating formed at the input/output pads of an integrated circuit element or substrate. The composite bump is formed using material deposition, lithography, and etching techniques. A layer of soldering metal can be formed on the composite bumps if this is desired for subsequent processing. A base metal pad covering the integrated circuit element input/output pad can be used to provide added flexibility in location of the composite bump. The composite bump can be formed directly on the input/output pad or on the base metal pad.

21 Claims, 28 Drawing Sheets

COMPOSITE BUMP STRUCTURES

This is a division of patent application Ser. No. 08/507,533, filing date Jul. 26, 1995 now U.S. Pat. No. 5,707,902, Composite Bump Structure And Methods Of Fabrication, assigned to the same assignee as the present invention which is a Continuation-in-Part Application of Ser. No. 08/387,095, filed Feb. 13, 1995 also entitled "Composite Bump Structure and Methods of Fabrication," now abandoned.

RELATED PATENT APPLICATIONS (1) (E83-0002), Ser. No. 08/239,375, filed May 6, 1994, entitled Composite Bump Bonding assigned to the same assignee.

(2) (E83-0004), Ser. No. 08/239,380, filed May 6, 1994, entitled Composite Bump Flip Chip Bonding assigned to the same assignee.

(3) (E83-0003A), U.S. Pat. No. 5,393,697, to Chang et al, Feb. 28, 1995, entitled "Composite Bump Structure and Methods of Fabrication," filed May 6, 1994.

(1) Field of the Invention

The invention relates to the joining of integrated circuit elements to the next level of integration and more particularly to the formation of the bonded structure which comprises the physical and electrical connection between the integrated circuit element and the next level of integration.

(2) Description of the Related Art

In the manufacture of highly dense integrated circuits the formation of an inexpensive and highly reliable mechanical bond and electrical interconnection has long been recognized to be of key importance. Some time ago a solution to his need was patented by L. F. Miller et al in U.S. Pat. No. 3,401,126. This method worked well for many years but increasing levels of integration and circuit density have made the need for interconnections on an increasingly fine pitch of key importance.

A method for achieving increased interconnection density was patented by K. Hatada in U.S. Pat. No. 4,749,120. This method employs a gold bump as the electrical interconnection between the IC circuit chip and the substrate while holding the IC chip in place with a resin coating on the substrate acting as an adhesive between chip and substrate. This method has the disadvantage of a relatively high Young's Modulus for metal. As a result of the high Young's Modulus a very large bonding force is required between the IC chip and the substrate during the bonding process while the resin is undergoing its curing cycle. After the bonding process the gold bump will tend to return to its original shape and the recoil forces will disengage some of the bumps from the electrodes on the substrate. Another method patented by Y. Tagusa et al in U.S. Pat. No. 4,963,002 employs nickel plated plastic beads or silver particles to achieve the electrical connection, but the former suffers from small contact area and the latter has the disadvantage of the relatively high Young's Modulus for silver.

U.S. Pat. No. 4,916,523 issued to Sokolovsky et al shows a unidirectional conductive adhesive to bond the integrated circuit to the substrate. U.S. Pat. No. 5,134,460 issued to Brady et al shows conductive metal bumps coated with a gold layer.

A Japanese patent, No. 5-144823, shows conductive metal strips over a plastic bar. In the Japanese patent the metal strips go to the top of the bar but not completely over the top of the bar, contacts to the input/output pads are not under the plastic bar but at the side of the plastic bar, and a base metal pad over the input/output pad is not used. In the invention of this Patent Application the metal extends completely over the top of the polymer body which provides improved adhesion, the location of the composite bump is flexible, and a base metal pad is used giving added flexibility in location of the composite bump.

SUMMARY OF THE INVENTION

It is the principal object of this invention to provide a composite bump which can be formed on an integrated circuit element, on the substrate to which the integrated circuit element is connected, or on both the integrated circuit element and the substrate. The composite bumps are comprised of a single polymer body with a Young's Modulus which is low compared to metals and a conductive metal coating covering the polymer body. The conductive metal coating covering the polymer body must be chosen to provide good adhesion to the polymer body and may include an adhesive layer and a barrier layer in addition to a conductor layer. The composite bump forms part of the physical and electrical bond between the integrated circuit element and the substrate. The low Young's Modulus of the polymer, between about $0.4 \times 10^6$ and $0.5 \times 10^6$ psi, allows the bond to be made with very low bonding force, greatly reduces or eliminates the force tending to separate the connections after bonding, and results in extremely reliable physical and electrical connections between the integrated circuit element and substrate.

A further objective of the invention is to provide methods of fabrication of the composite bump on either an integrated circuit element or a substrate to which an integrated circuit element can be connected. This objective is achieved by depositing a layer of polymer on the surface of an integrated circuit element or substrate. Using photolithographic techniques the polymer is removed everywhere except at the location of the integrated circuit element or substrate input/output pads. Metal is then deposited over the surface of the integrated circuit element or substrate. Using photolithographic techniques the metal is removed everywhere except at the location of the integrated circuit element or substrate input/output pads and the composite bumps are formed. The resulting composite bumps have a single polymer body with a low Young's Modulus relative to metals and a conductive metal coating covering the polymer body. In some instances a metal layer can be formed on the input/output pads and under the polymer body. This metal layer reduces the sheet resistance of the input/output pads. The polymer body must be chosen to withstand the temperatures of subsequent processing such as bonding. The polymer body must also be chosen so that it can be etched during fabrication of the composite bump. Polyamic acid polyimide fulfills these requirements. The conductive metal coating covering the polymer body must be chosen to provide good adhesion to the polymer body and may include an adhesive layer and a barrier layer in addition to a conductor layer.

These objectives can be achieved by forming polymer bodies directly on the input/output pads of the integrated circuit element or substrate. In this case the conductive metal coating over the polymer body must make contact with the input/output pad on which a particular polymer body is formed.

These objectives can also be achieved by forming polymer bodies on a base metal pad. In this case the base metal pad must be formed over and make contact with the input/output pads. In this case the conductive metal coating over the polymer body must make contact with the base metal pad. One advantage in using the base metal pad is that the composite bump need not be located directly over the input/output pads but can be moved to a different location which can have distinct advantages in circuit layout on the integrated circuit element or substrate.

In this invention the composite bumps are formed directly on the integrated circuit element or substrate and are not formed separately and later attached to the integrated circuit element or substrate. The composite bumps are formed using a combination of etching and lift-off methods to form the base metal pads, the polymer bodies, and the conductive metal coatings. All combinations of etching and lift-off methods can be used.

DESCRIPTION OF THE PREFERRED EMBODIMENTS

Figure 1A:
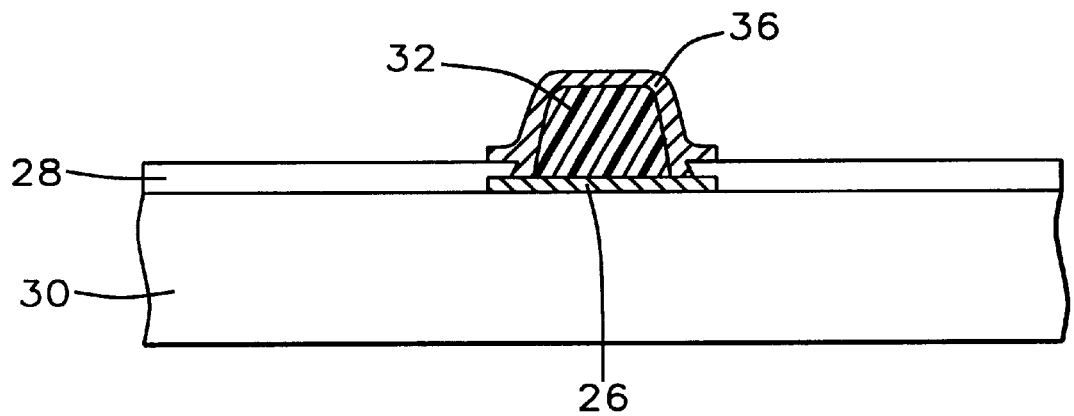
FIG. 1A shows a cross sectional view of a composite bump formed on an integrated circuit element or substrate.

FIG. 1A shows an embodiment of the composite bump formed on either an integrated circuit element or on a substrate. A passivation layer 28 and an aluminum input/output pad 26 of about 90 microns diameter is formed on an integrated circuit element or substrate 30. A polymer body 32 with a thickness of between about 5 microns and 25 microns is formed on the input/output pad 26. The polymer body can be polyamic acid polyimide.

Figure 1B:
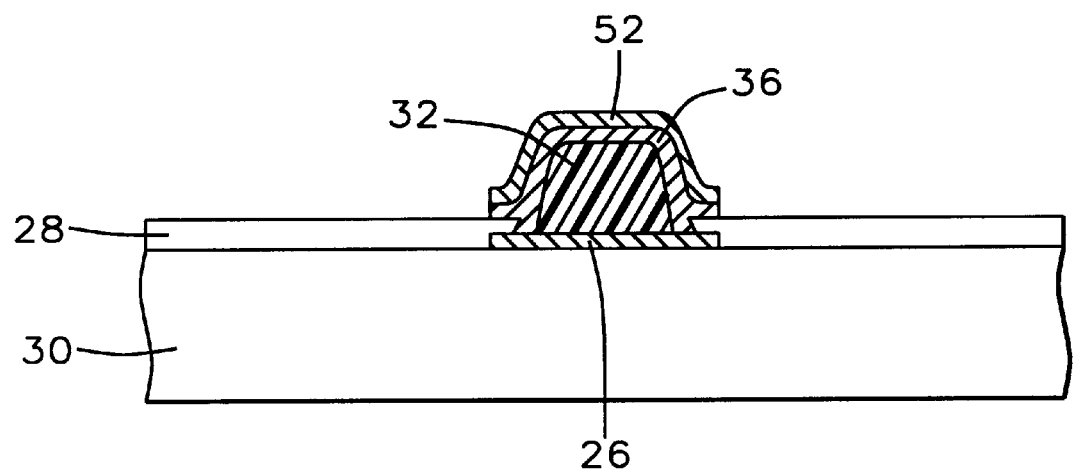
FIG. 1B shows a cross sectional view of a composite bump formed on an integrated circuit element or substrate with a solder coating on the composite bump.

A conductive metal coating 36 is formed over the polymer body and must adhere to the polymer body. The coating can be a metal such as aluminum or nickel; or a composite such as nickel/gold, chrome/gold, chrome/silver, or titanium/platinum. The conductive metal coating 36 can be a composite which includes an adhesion layer/a barrier layer/a conductor layer such as chrome/copper/gold, chrome/nickel/gold, chrome/silver/gold, titanium/platinum/gold, titanium/ palladium/gold, or titanium/tungsten/silver. A solder coating, such as PbSn, InGa, or InSn may be formed over the conductive metal coating, shown in FIG. 1B, if this is desired for a soldering process. In this case the preferred conductive metal coatings are chrome/copper/gold, chrome/ nickel/gold, chrome/silver/gold, titanium/platinum/gold, or titanium/palladium/gold.

Figure 2:
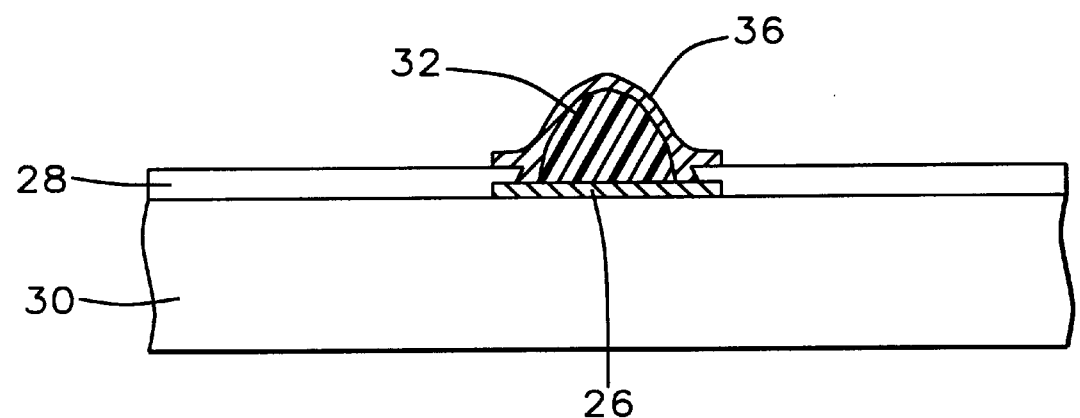
FIG. 2 shows a cross sectional view of a composite bump formed in a hemispherical shape on an integrated circuit element or substrate.
Figure 3:
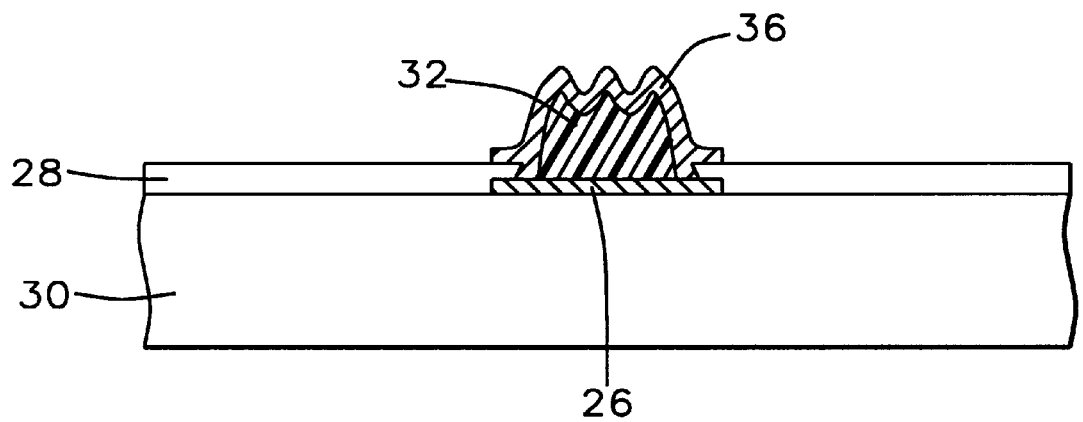
FIG. 3 shows a cross sectional view of a composite bump formed with a rough shape on an integrated circuit element or substrate.
Figure 4:
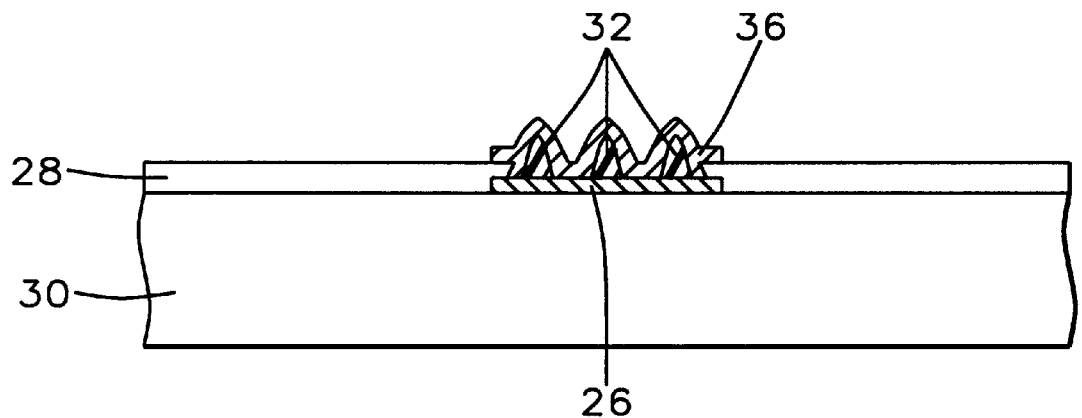
FIG. 4 shows a cross sectional view of composite bumps formed so there are multiple bumps within the input/output pattern of an integrated circuit element or substrate.
Figure 5:
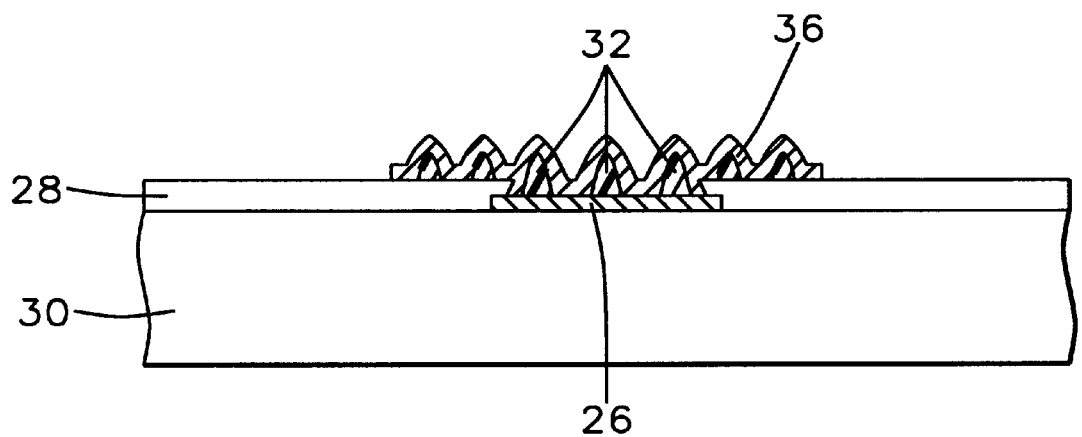
FIG. 5 shows a cross sectional view of composite bumps formed so there are multiple bumps within and extending beyond the input/output pattern of an integrated circuit element or substrate.
Figure 6:
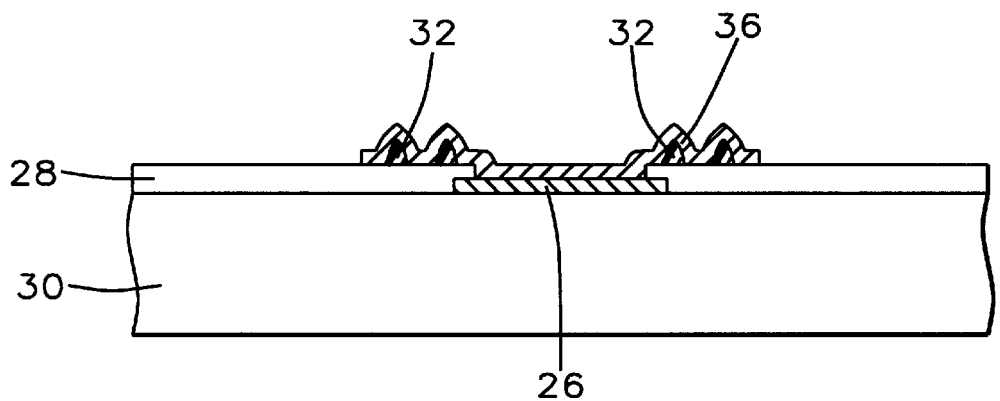
FIG. 6 shows a cross sectional view of composite bumps formed so there are multiple bumps forming a ring around the input/output pattern of an integrated circuit element or substrate.

Additional embodiments of the composite bump are shown in FIGS. 2 through 6. FIG. 2 shows a composite bump formed in a hemispherical shape. FIG. 3 shows a composite bump formed with a rough surface on the bump. FIG. 4 shows multiple composite bumps formed inside the input/output pattern 26 of the integrated circuit element or substrate 30. FIG. 5 shows multiple composite bumps formed both inside and in a ring surrounding the input/ output pattern 26 of the integrated circuit element or substrate 30. FIG. 6 shows multiple composite bumps formed in a ring surrounding the input/output pattern 26 of the integrated circuit element or substrate 30.

Figure 8A:
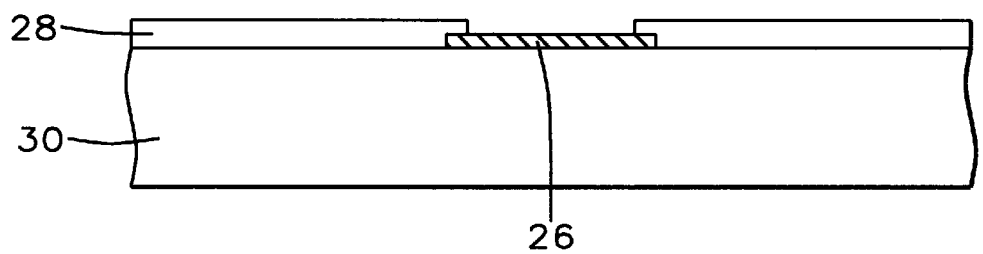
FIGS. 8A through 8J show cross sectional representations of the method for forming composite bumps with a base metal layer under the composite bump and on top of the input/output pad using photoresist for patterning the polymer and metal layers.
Figure 8B:
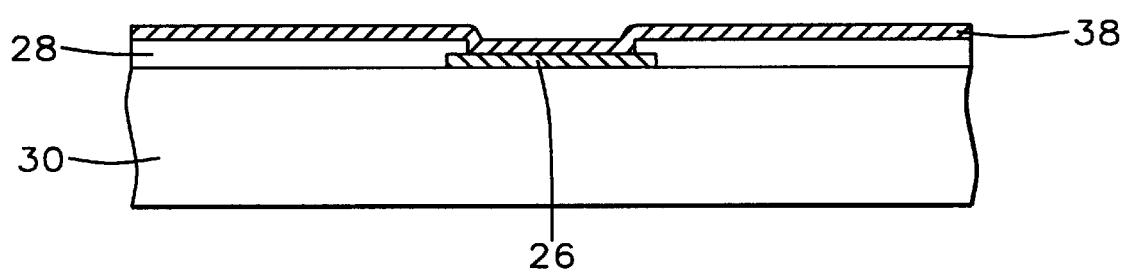
Figure 8C:
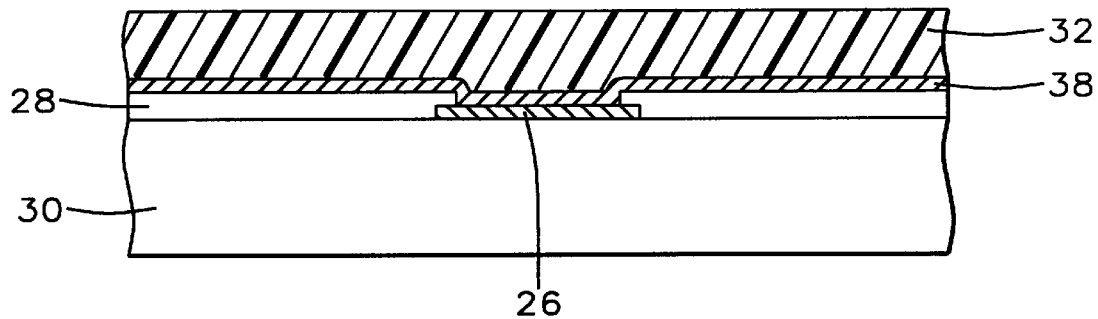
Figure 8D:
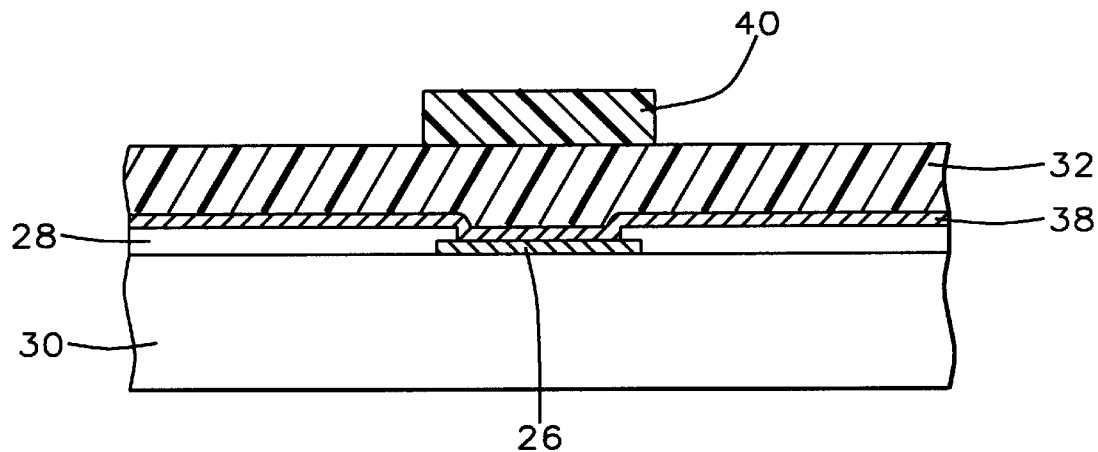
Figure 8E:
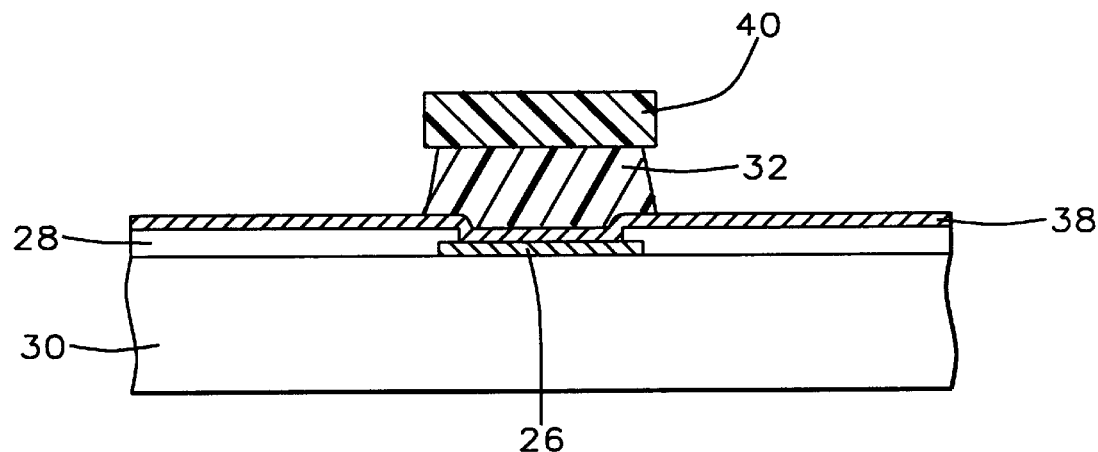
Figure 8F:
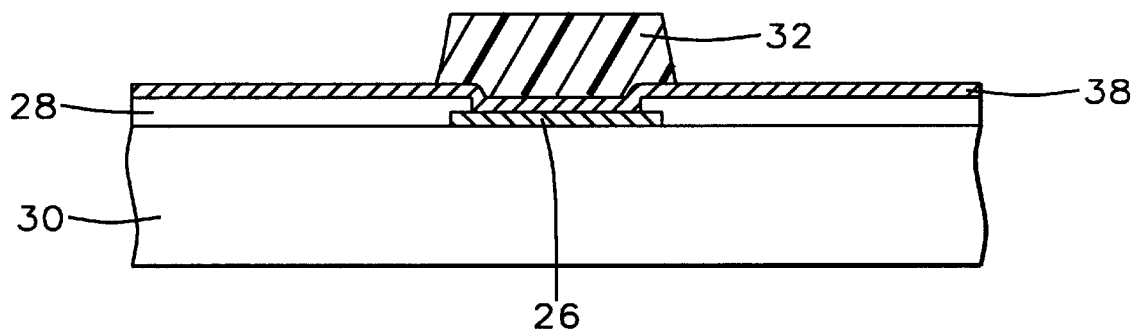
Figure 8G:
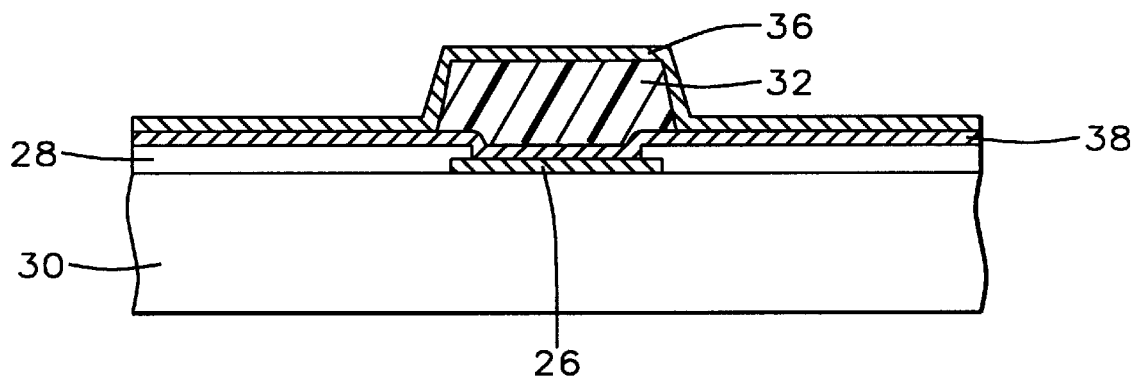
Figure 8H:
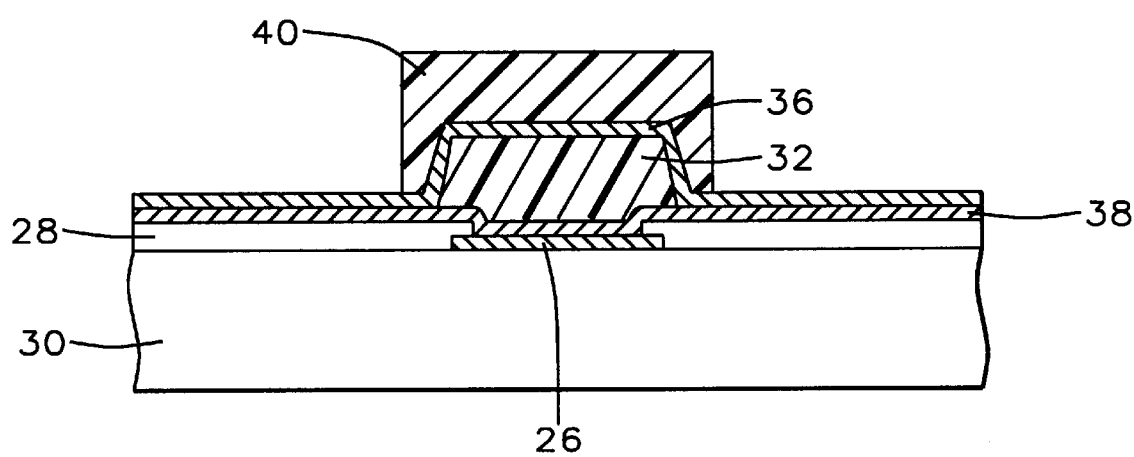
Figure 8I:
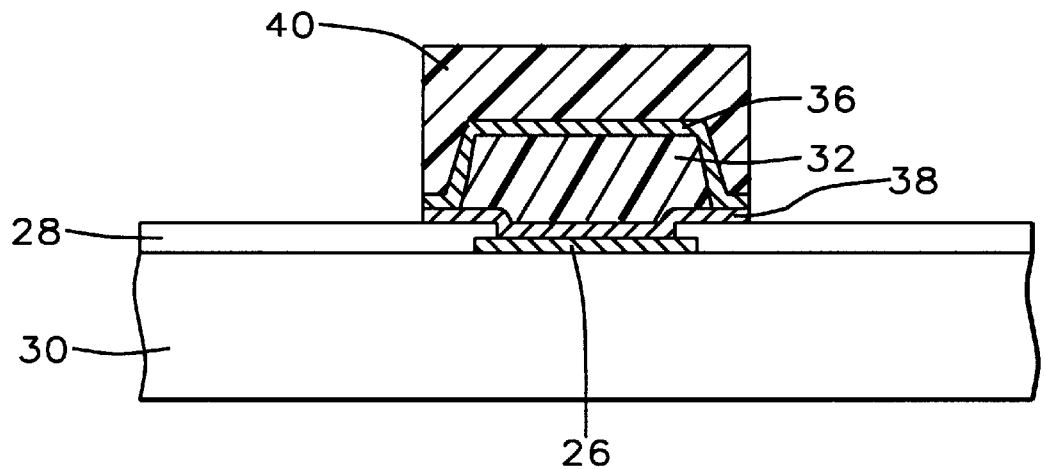
Figure 8J:
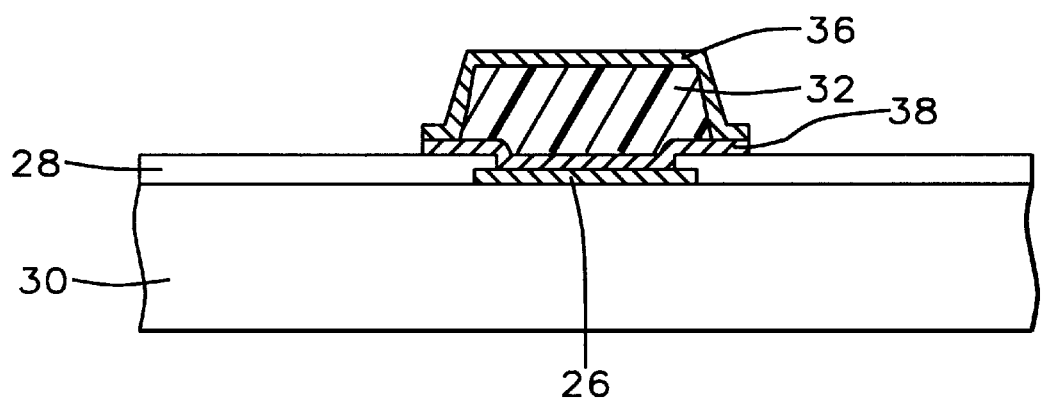

The above embodiments may also have a base metal layer of aluminum 38 formed under the polymer body 32 and on top of the input/output pad 26 as shown in FIG. 8J. This base metal layer extends over the edges of the passivation layer 28.

Figure 7A:
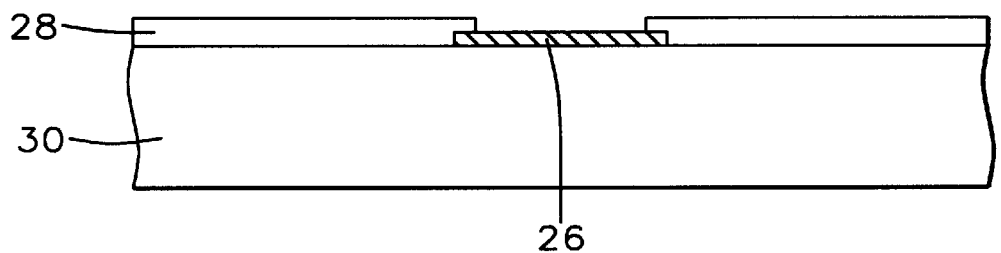
FIGS. 7A through 7I show cross sectional representations of the method for forming composite bumps using photoresist for patterning the polymer and metal layers.
Figure 7B:
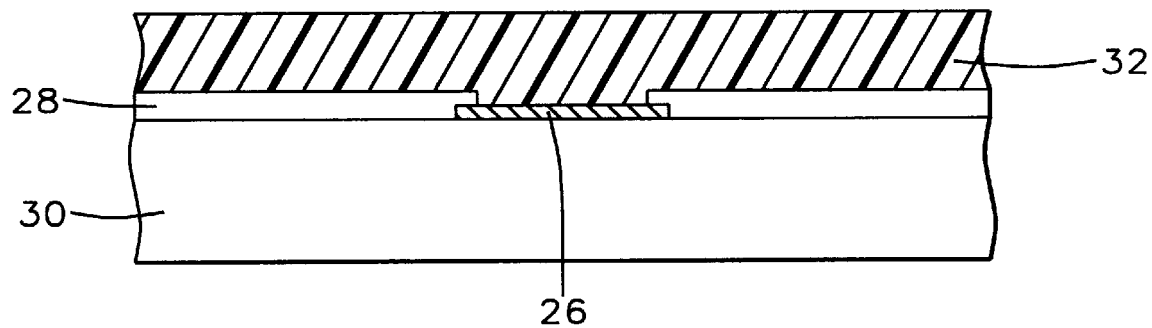
Figure 7C:
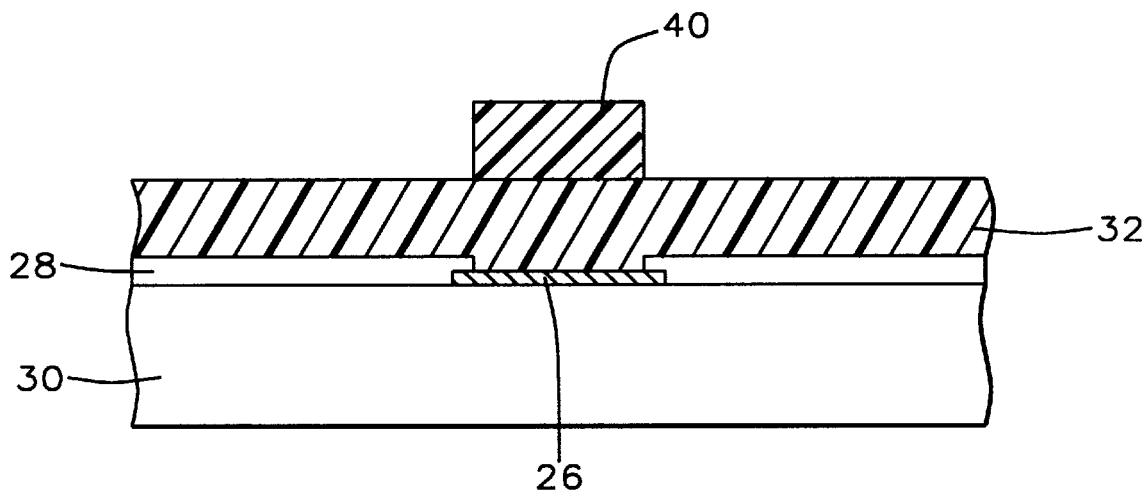
Figure 7D:
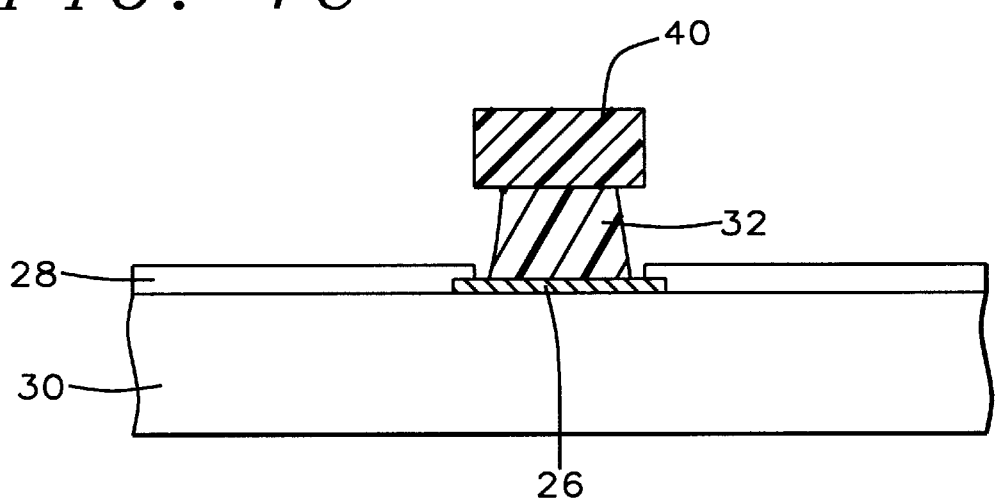
Figure 7E:
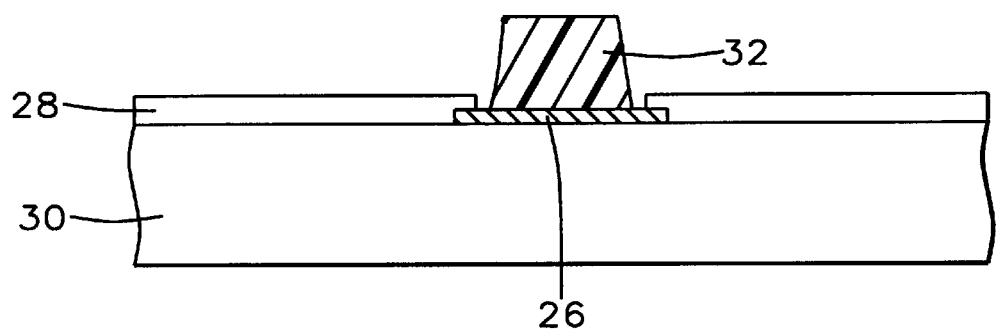
Figure 7F:
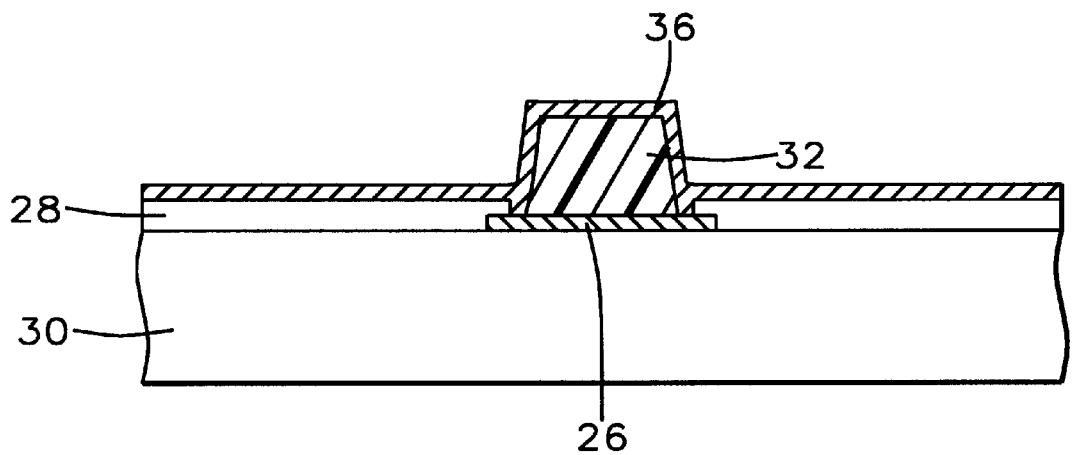

Refer now more particularly to FIGS. 7A through 7I. There is shown an embodiment of a method for forming the composite bump of the current invention. First the integrated circuit element or substrate 30 with a passivation layer 28 and aluminum input/output pads 26 with a diameter of about 90 microns is etched and cleaned, as shown in FIG. 7A. Next, as shown in FIG. 7B, a layer of non photosensitive polymer 32 such as a polyamic acid polyimide with a thickness of between about 5 and 25 microns is formed on the surface of the integrated circuit element or substrate 30. Next, as shown in FIG. 7C, a photoresist pattern 40 is formed on the polyamic acid polyimide. As shown in FIG. 7D, the polyamic acid polyimide is then etched to the photoresist pattern. Patterning of polyimide films is described in Chapter 8 of POLYIMIDES edited by Wilson, Stenzenberger, and Hergenrother published by Blackie & Son Ltd. in 1990. The photoresist is then stripped, FIG. 7E. As shown in FIG. 7F a conductive metal layer 36 such as a composite of chrome/gold with chrome about 500 Angstroms thick and gold about 2000 Angstroms thick is deposited on the integrated circuit element or substrate 30. The coating 36 can also be a metal such as aluminum or nickel; or a composite such as nickel/gold, chrome/silver, or titanium/platinum. The conductive metal coating 36 can also be a composite which includes an adhesion layer/a barrier layer/a conductor layer such as chrome/copper/gold, chrome/nickel/gold, chrome/silver/gold, titanium/platinum/ gold, titanium/palladium/gold, or titanium/tungsten/silver.

Figure 7G:
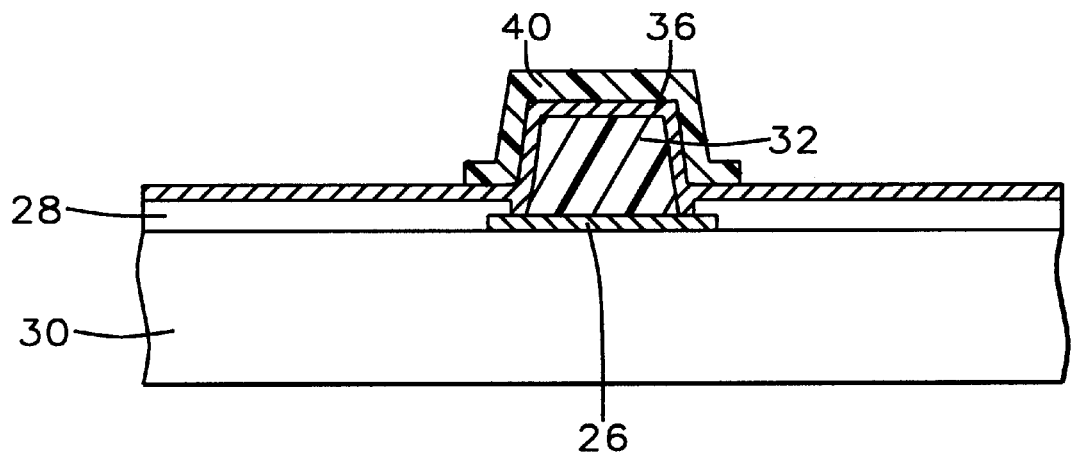
Figure 7H:
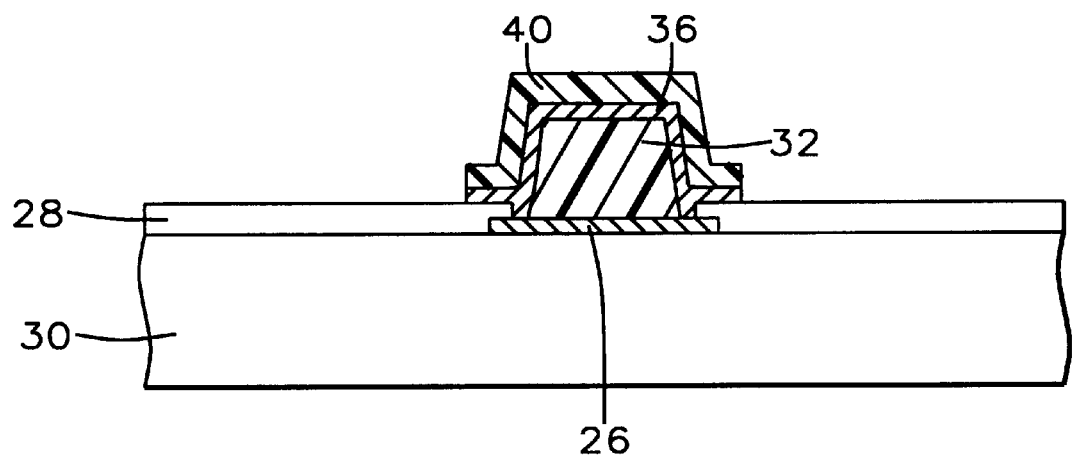

A patterned layer of photoresist 40, FIG. 7G, is then formed on the conductive metal layer 36 and the conductive metal layer is etched to the pattern of the photoresist 40, FIG. 7H. The photoresist is then stripped, FIG. 7I, and the composite bump is formed. For the chrome/gold conductive metal layer etching can be accomplished using 1 g Ce($SO_4$)$_2$*2($NH_4$)$_2SO_4$*2$H_2O$+5 ml $HNO_3$+25 ml $H_2O$ at 28° C. to etch chrome at about 85 Angstroms/minute and 4 g KI+1 g $I_2$+40 ml $H_2O$ at room temperature to etch gold at between about 0.5 and 1.0 microns/minute.

Another embodiment method is shown in FIGS. 8A through 8J. The integrated circuit element or substrate 30 with a passivation layer 28 and aluminum input/output pads 26 with a diameter of about 90 microns is etched and cleaned, as shown in FIG. 8A. Next, as shown in FIG. 8B, a layer of metal 38 such as aluminum is deposited on the integrated circuit element or substrate 30. The method then proceeds as described in the immediately preceding embodiment beginning with the formation of the layer of polyamic acid polyimide 32 and continuing until the conductive metal coating 36 is etched, FIGS. 8C to 8I. The aluminum 38 is then etched using $H_3PO_4$:$CH_3COOH$:$HNO_3$:$H_2O$(4:4:1:1) at room temperature at about 350 Angstroms/minute. As shown in FIG. 8J the photoresist is then stripped and the composite bump is formed.

Figure 9A:
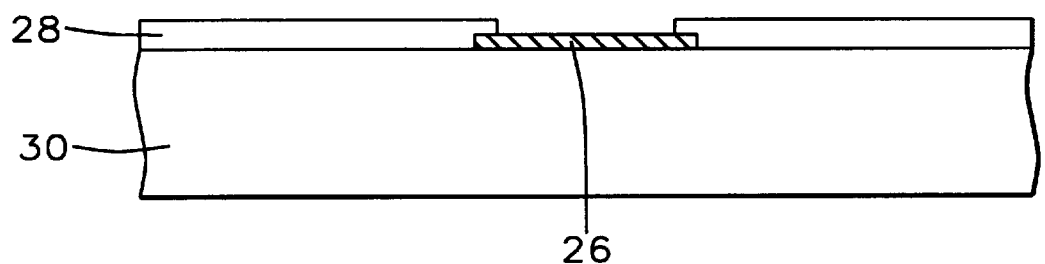
FIGS. 9A through 9G show cross sectional representations of the method for forming composite bumps using photosensitive polymer to pattern the polymer layer and photoresist to pattern the metal layer.
Figure 9B:
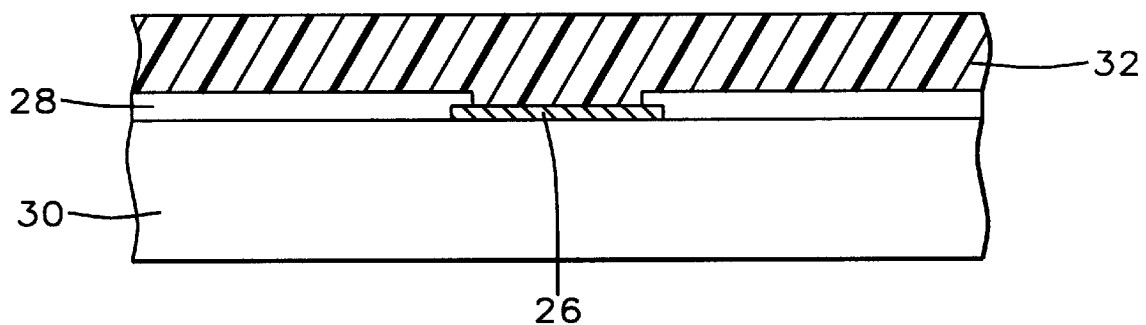
Figure 9C:
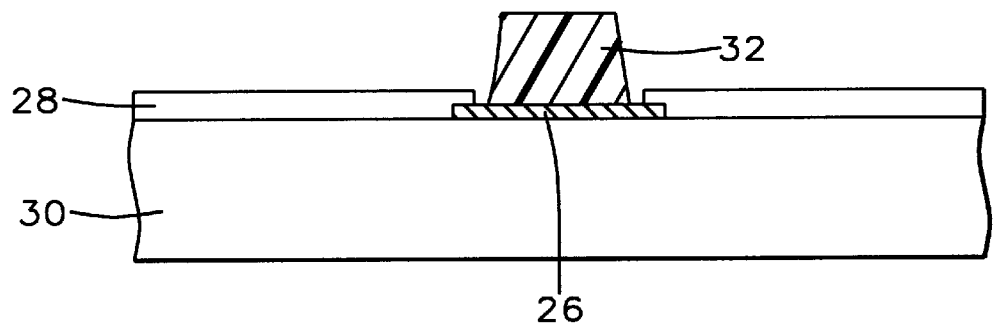
Figure 9D:
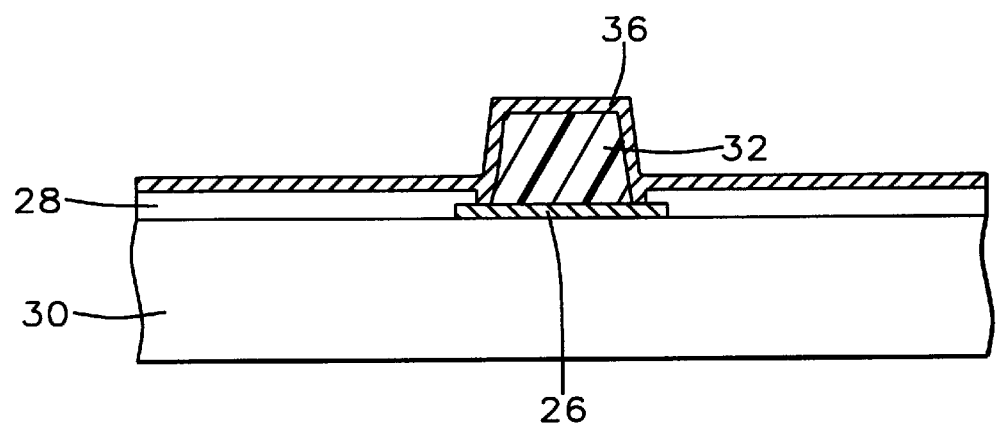
Figure 9E:
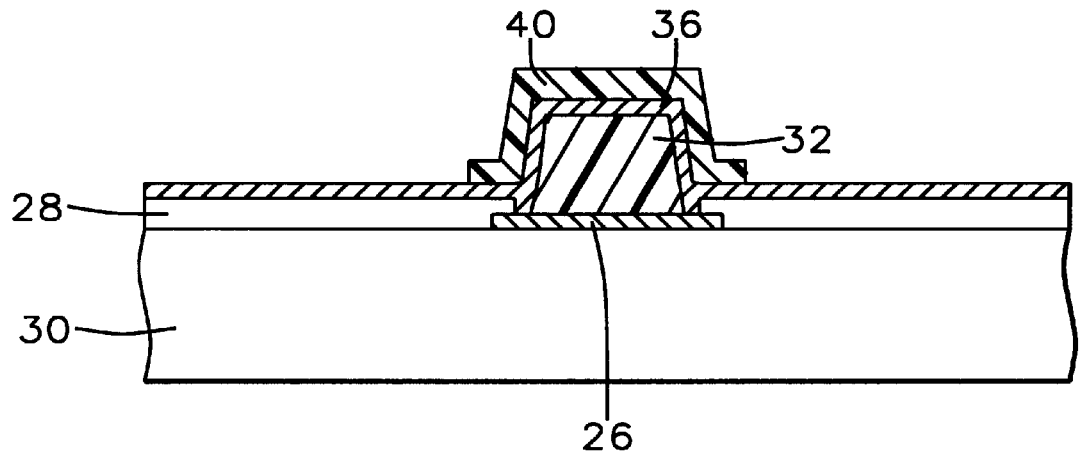
Figure 9F:
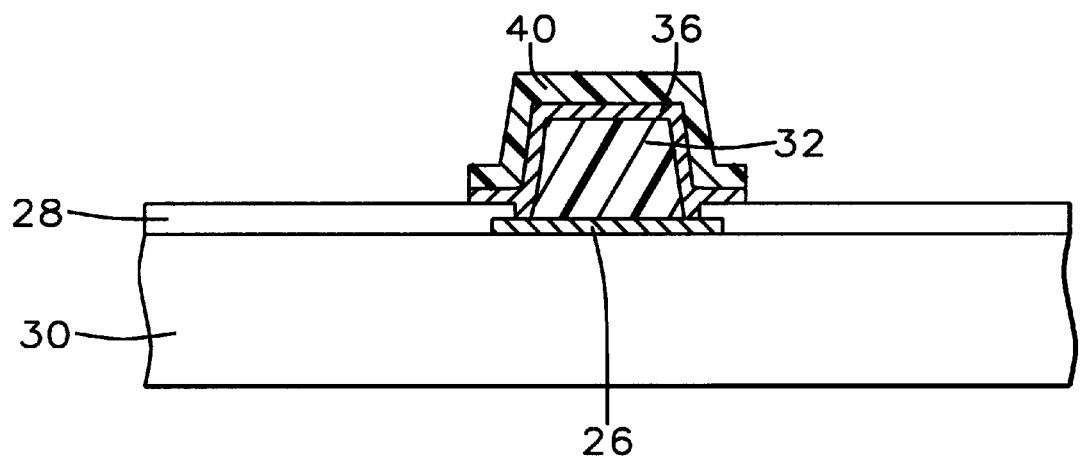

Another embodiment method is shown in FIGS. 9A through 9G. After the integrated circuit element or substrate 30 with input/output pads of about 90 microns diameter is etched and cleaned, FIG. 9A, a layer of photosensitive polymer 32 such as photosensitive polyamic acid polyimide, with a thickness of between about 5 and 25 microns is formed on the surface integrated circuit element or substrate 30, FIG. 9B. The photosensitive polymer 32 is exposed and developed leaving polymer 32 only over the input/output pads, FIG. 9C. Patterning of polyimide films is described in Chapter 8 of POLYIMIDES edited by Wilson, Stenzenberger, and Hergenrother published by Blackie & Son Ltd. in 1990. Next a conductive metal layer 36 such as a composite of chrome/gold is deposited on the integrated circuit element or substrate 30 as shown in FIG. 9D and the process proceeds as described in the previous embodiment, FIGS. 9E, 9F, and 9G.

Figure 10A:
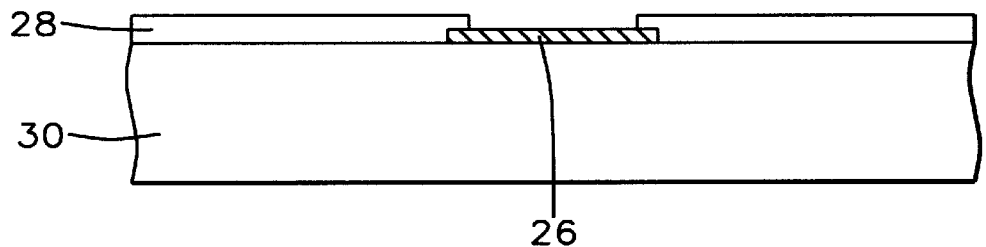
FIGS. 10A through 10H show cross sectional representations of the method for forming composite bumps with a base metal layer under the composite bump and on top of the input/output pad using photosensitive polymer to pattern the polymer layer and photoresist to pattern the metal layer.
Figure 10B:
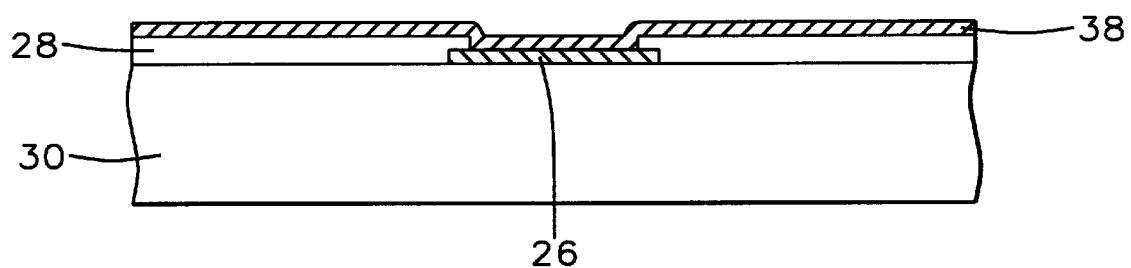
Figure 10C:
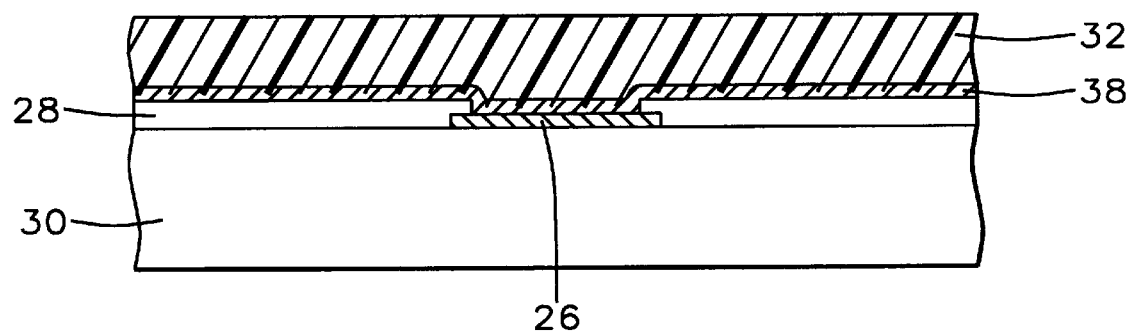
Figure 10D:
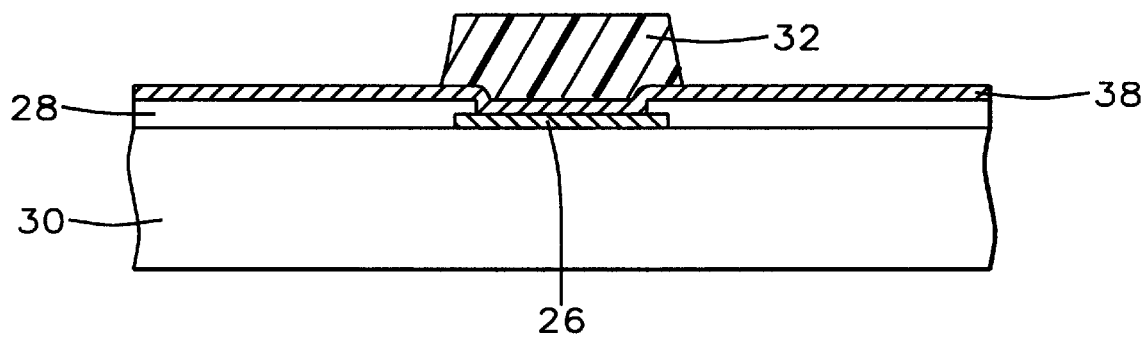
Figure 10E:
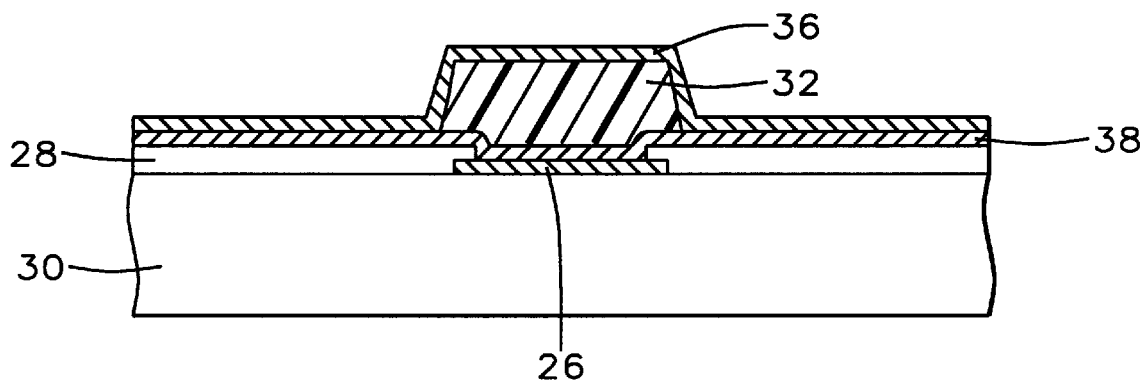
Figure 10F:
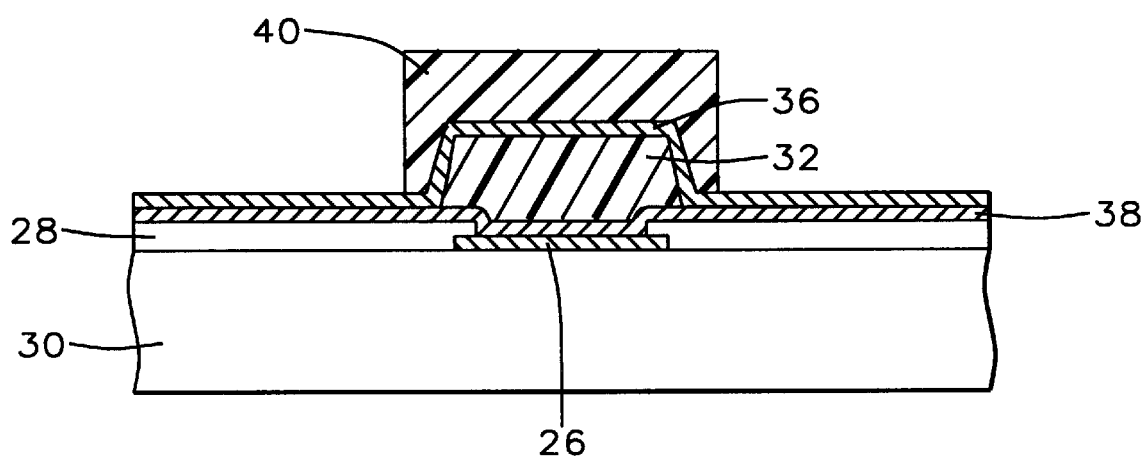
Figure 10G:
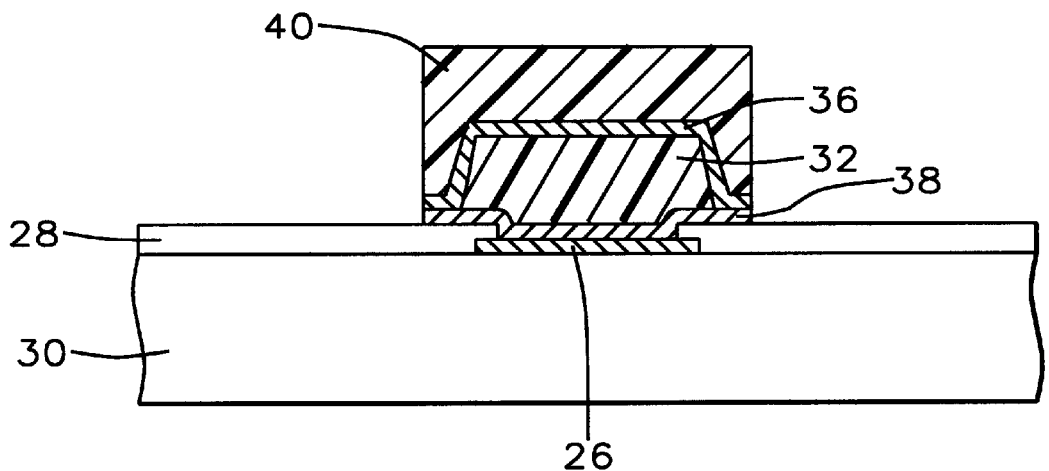
Figure 10H:
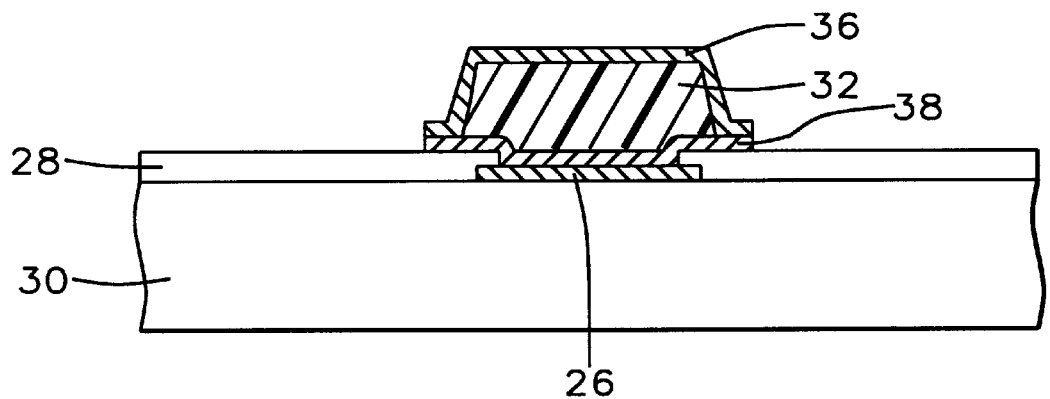

Another embodiment method is shown in FIGS. 10A through 10J. The integrated circuit element or substrate 30 with a passivation layer 28 and aluminum input/output pads 26 with a diameter of about 90 microns is etched and cleaned, as shown in FIG. 10A. Next, as shown in FIG. 10B, a layer of metal 38 such as aluminum is deposited on the integrated circuit element or substrate 30. The method then proceeds as described in the immediately preceding embodiment beginning with the formation of the layer of photosensitive polyamic acid polyimide 32 and continuing until the conductive metal coating 36 is etched, FIGS. 10C to 10G. The aluminum 38 is then etched using $H_3PO_4$:$CH_3COOH$:$HNO_3$:$H_2O$ (4:4:1:1) at room temperature at about 350 Angstroms/minute. As shown in FIG. 10H the photoresist is then stripped and the composite bump is formed.

Figure 11A:
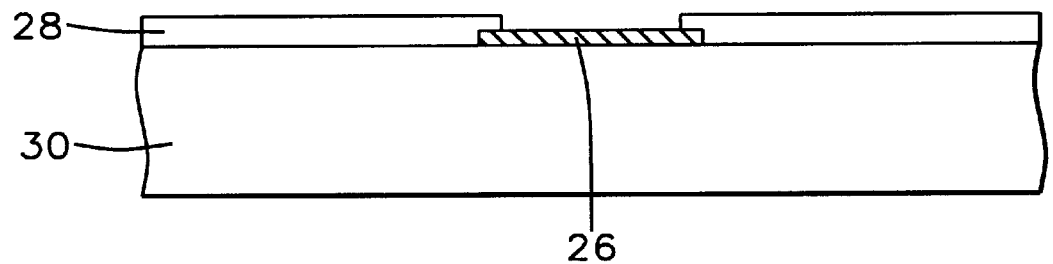
FIGS. 11A through 11E show cross sectional representations of the method for forming composite bumps using a lift off process.
Figure 11B:
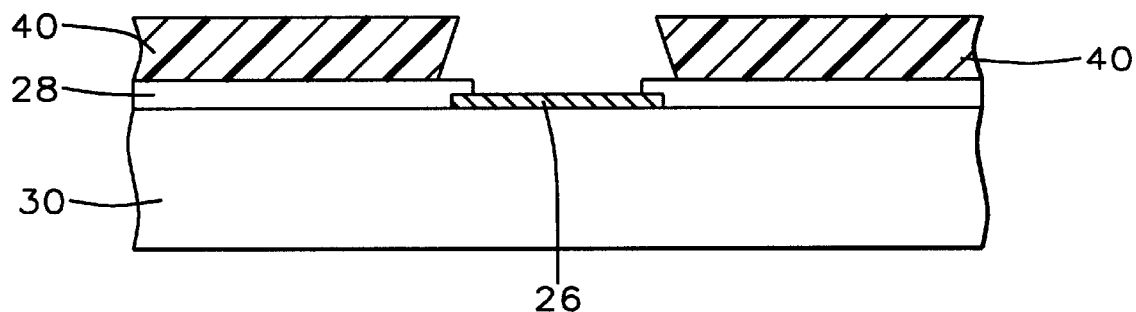
Figure 11C:
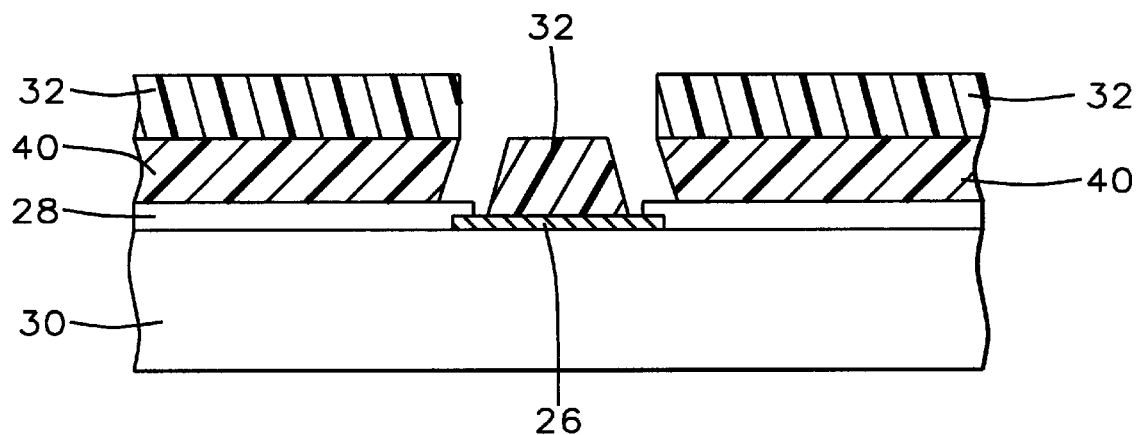
Figure 11D:
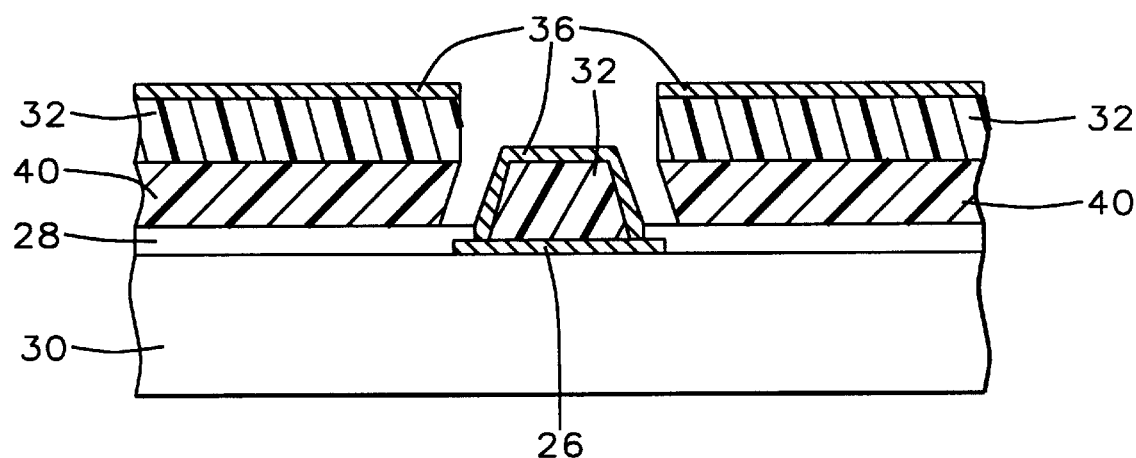
Figure 11E:
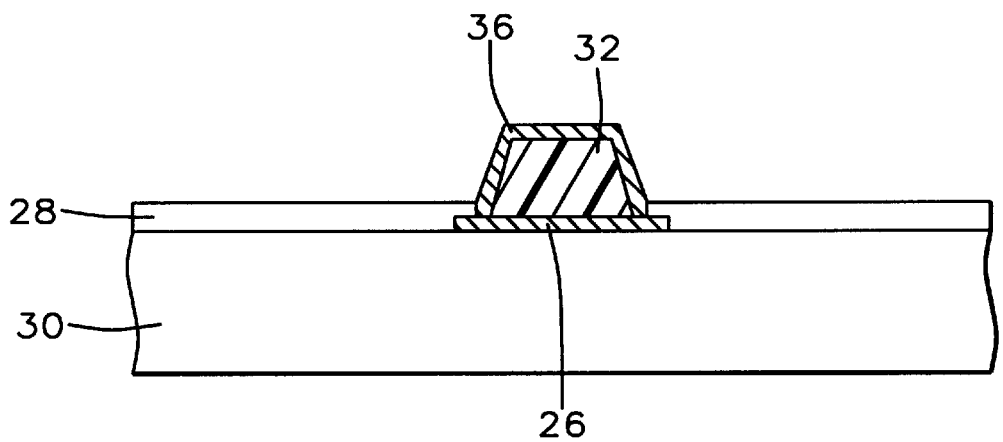

Another embodiment is shown in FIGS. 11A through 11E. First the integrated circuit element or substrate 30 with about 90 micron diameter input/output pads 26 is etched and cleaned, FIG. 11A. Next a photo resist mask 40 is formed leaving photoresist everywhere except over the input/output pads 26, FIG. 11B. Next a layer of polymer 32 is formed on the integrated circuit element of substrate 30 using vapor deposition polymerization. In a vacuum of about $3.75 \times 10^{-5}$ Torr 4,4 Oxy-Dianiline (ODA) is sprayed onto the integrated circuit element or wafer and heated to between about 80° C. and 160° C. While still at $3.75 \times 10^{-5}$ Torr pyromellitic dianhydride (PMDA) is sprayed onto the integrated circuit element or wafer and heated to between about 130° C. and 180° C. Vapor deposition polymerization is described by Takahashi et al in MACROMOLECULES, Vol. 24, No. 12, 1991, pp. 3543–3546. Next, as shown in FIG. 11D, a conductive metal layer 36 such as a composite of chrome/ gold with chrome about 500 Angstroms thick and gold about 2000 Angstroms thick is deposited on the integrated circuit element or substrate 30. The coating 36 can also be the same metals described in the previous embodiments. Then the photoresist mask 40 is removed thereby removing the polymer and metal deposited on the photoresist leaving the composite bump, FIG. 11E.

Figure 12A:
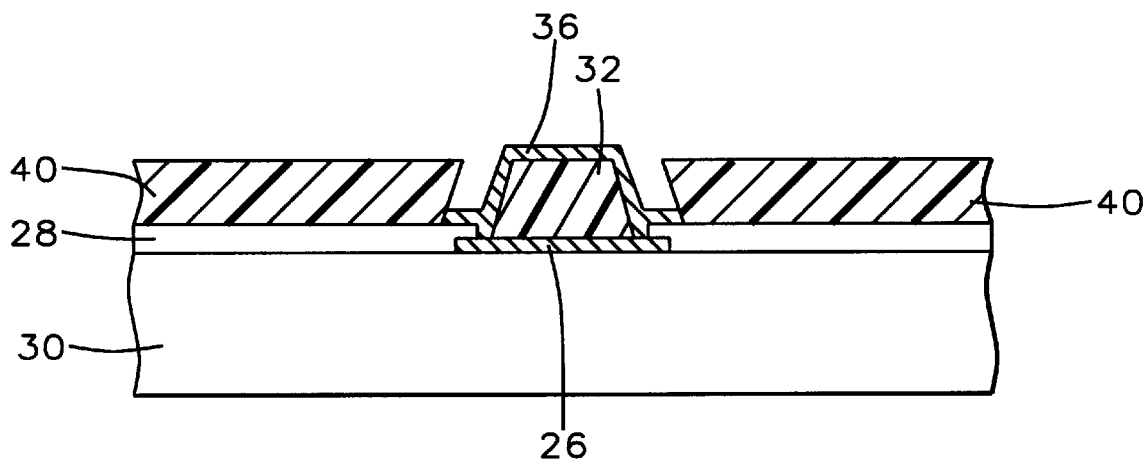
FIGS. 12A through 12C show cross sectional representations of the method for forming a solder layer on the composite bumps.
Figure 12B:
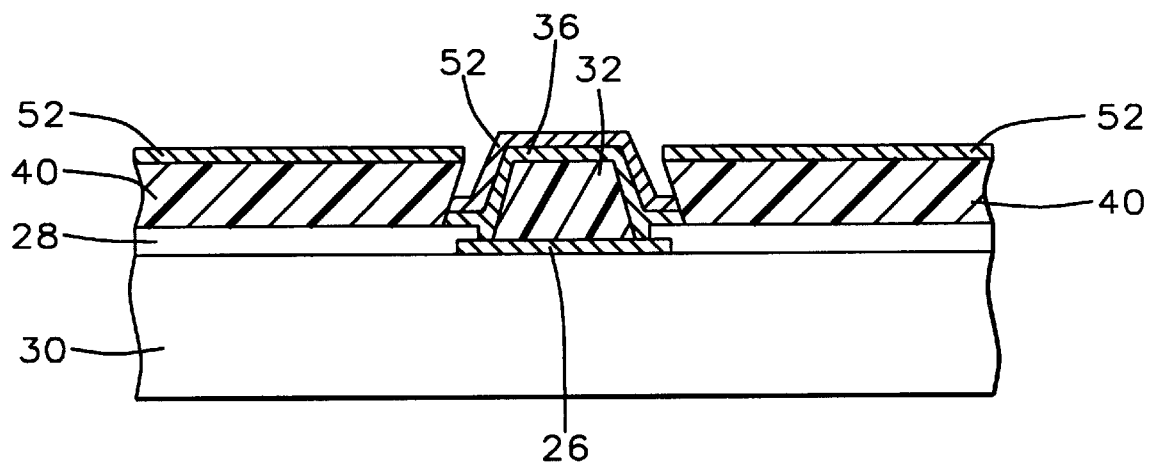
Figure 12C:
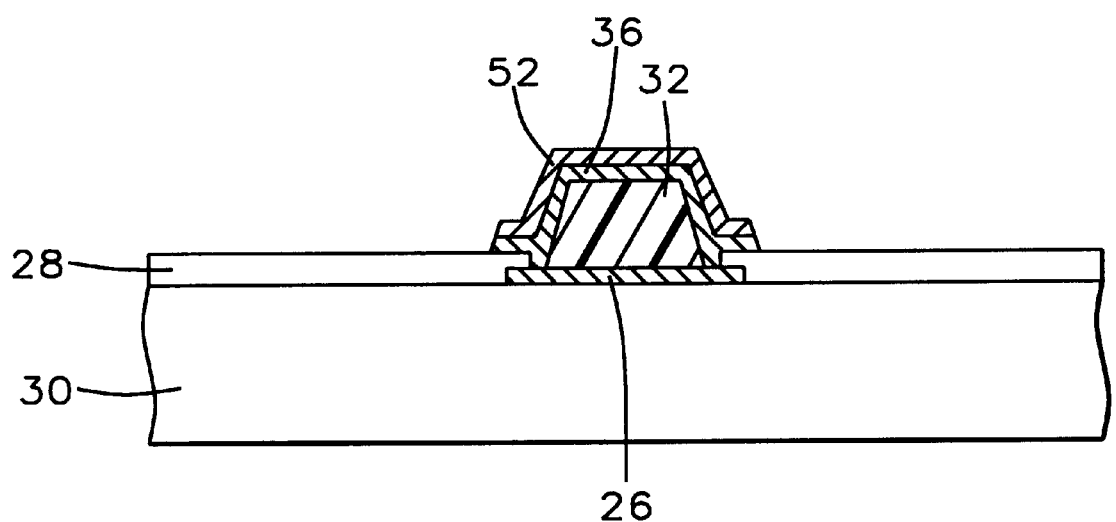

Another embodiment when a solder coating is desired on the composite bump is shown in FIGS. 12A through 12C. Composite bumps are formed on the integrated circuit element or substrate 30 using any of the preceding embodiment methods. In this case the preferred conductive metal coatings are chrome/copper/gold, chrome/nickel/gold, chrome/silver/gold, titanium/platinum/gold, or titanium/palladium/gold. A layer of photoresist 40 is then formed on the surface of the integrated circuit element or substrate 30 and patterned so that only the composite bumps are exposed, FIG. 12A. Solder 52, preferably 95% lead 5% tin is then deposited using chemical vapor deposition, FIG. 12B. Other percentages of lead and tin or solders using indium-tin or indium-gallium can also be used. The photoresist is then stripped thereby also removing the solder everywhere except on the composite bumps, FIG. 12C.

In the following embodiments the same metals, thicknesses, and methods of deposition for the conductive metal layer and base metal layer described in the previous embodiments can be used. In the following embodiments the same polymers, thicknesses, and methods of deposition for the polymer bodies described in the previous embodiments can be used.

Figure 7I:
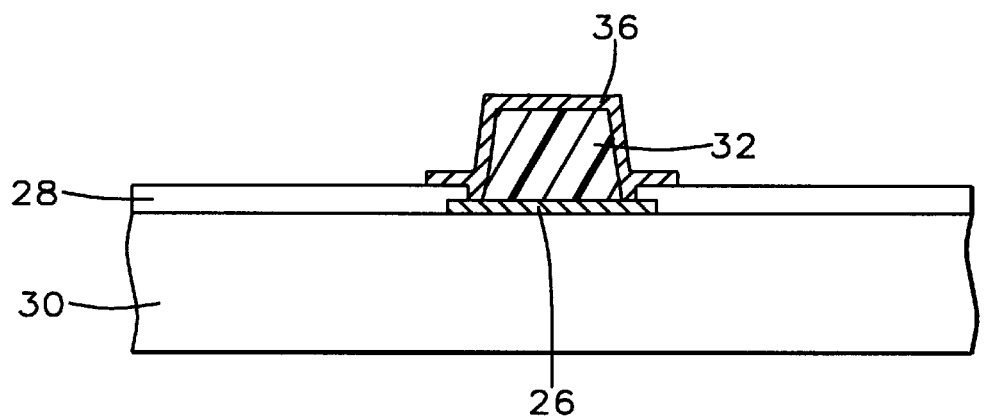
Figure 13:
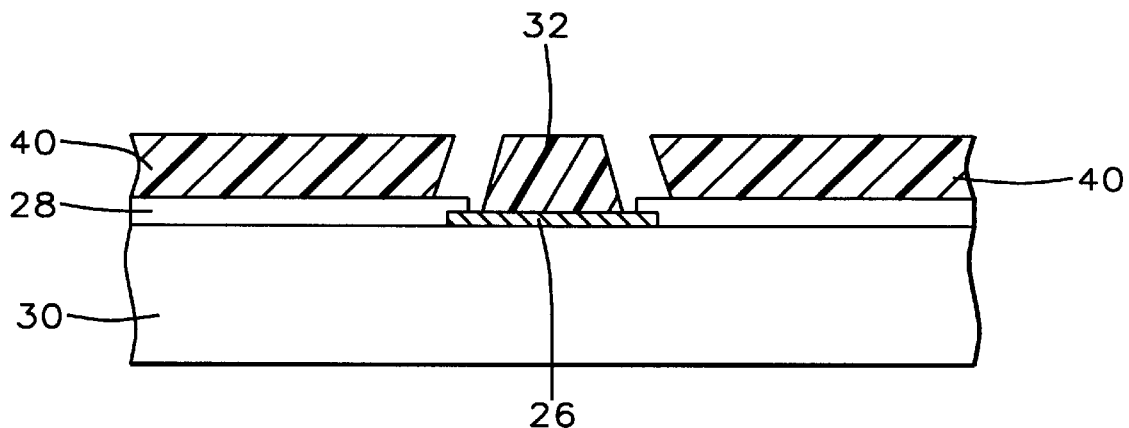
FIGS. 13 and 14 show cross sectional representations of the method for forming the conductive metal layer on the polymer bodies without base metal pads using a lift off method.
Figure 14:
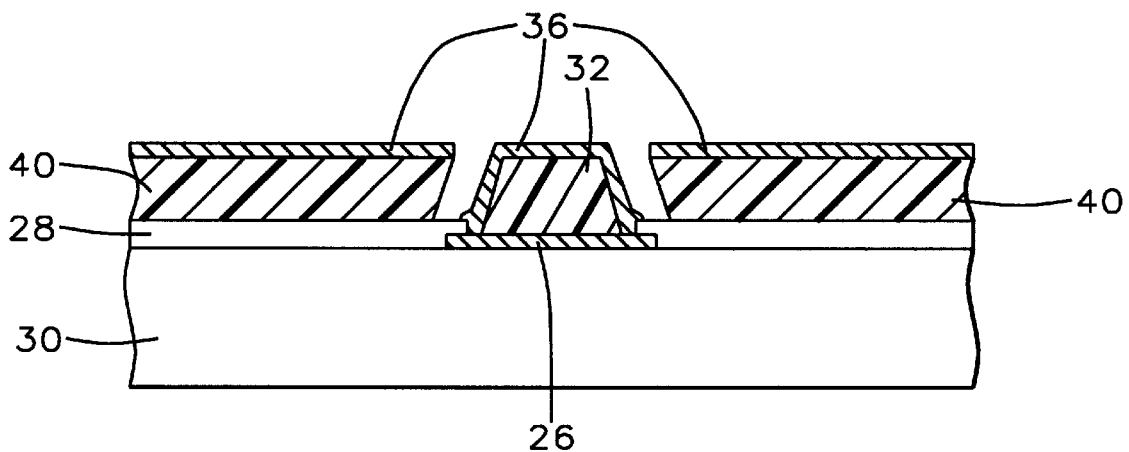

Another embodiment is shown in FIGS. 7A–7E, 13, 14, and 7I. First a dielectric passivation layer 28 is formed on an integrated circuit element or substrate 30 with aluminum input/output pads 26 having a diameter of about 90 microns, as shown in FIG. 7A. The dielectric passivation layer has openings over the input/output pads. Next, as shown in FIG. 7B, a layer of non photosensitive polymer 32 such as a polyamic acid polyimide with a thickness of between about 5 and 25 microns is formed on the surface of the integrated circuit element or substrate 30. Next, as shown in FIG. 7C, a first photoresist mask 40 is formed on the polyamic acid polyimide. As shown in FIG. 7D, the polyamic acid polyimide is then etched to the photoresist mask pattern forming a plurality of polymer bodies. The first photoresist mask is then removed, FIG. 7E. Next, as shown in FIG. 13, a second photoresist mask 40 having openings at the location of the polymer bodies 32 is formed over the passivation layer 28. As shown in FIG. 14 a conductive metal layer 36 is then formed on the second photoresist mask 40 and on the polymer body 32. As shown in FIG. 7I the second photoresist mask is then removed, removing that part of the conductive metal layer on the second photoresist mask and leaving the conductive metal layer on the polymer bodies. The composite bump is then formed.

Figure 9G:
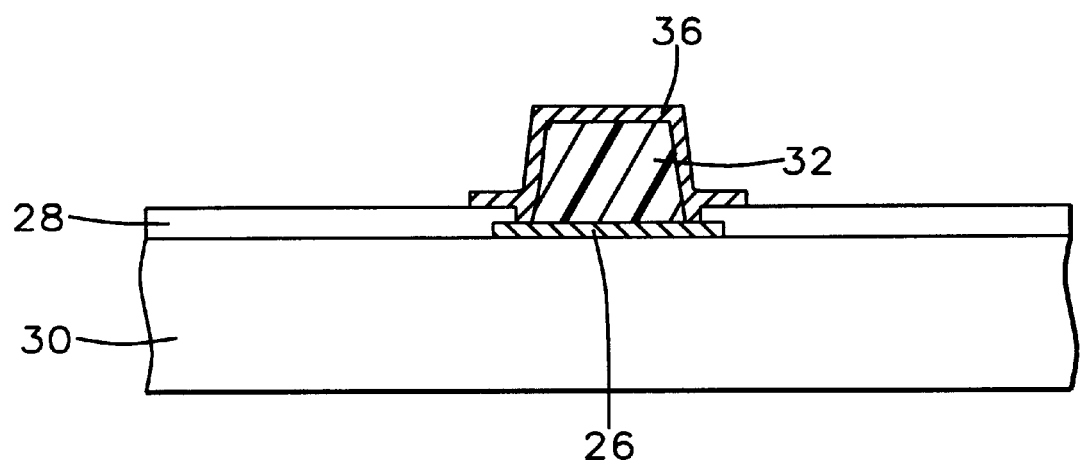

Another embodiment is shown in FIGS. 9A–9C, 13, 14, and 9G. First the integrated circuit element or substrate 30 with a passivation layer 28 and aluminum input/output pads 26 with a diameter of about 90 microns is etched and cleaned, as shown in FIG. 9A. Next, as shown in FIG. 9B, a layer of photosensitive polymer 32 such as described in previous embodiments with a thickness of between about 5 and 25 microns is formed on the surface of the integrated circuit element or substrate 30. Next, as shown in FIG. 9C, the photosensitive polymer is exposed and developed leaving a plurality of polymer bodies 32 on the input/output pads 26. Next, as shown in FIG. 13, a photoresist mask 40 having openings at the location of the polymer bodies 32 is formed over the passivation layer 28. As shown in FIG. 14 a conductive metal layer 36 is then formed on the photoresist mask 40 and on the polymer body 32. As shown in FIG. 9G the photoresist mask is then removed, removing that part of the conductive metal layer on the photoresist mask and leaving the conductive metal layer on the polymer bodies and the composite bumps are formed.

Figure 15:
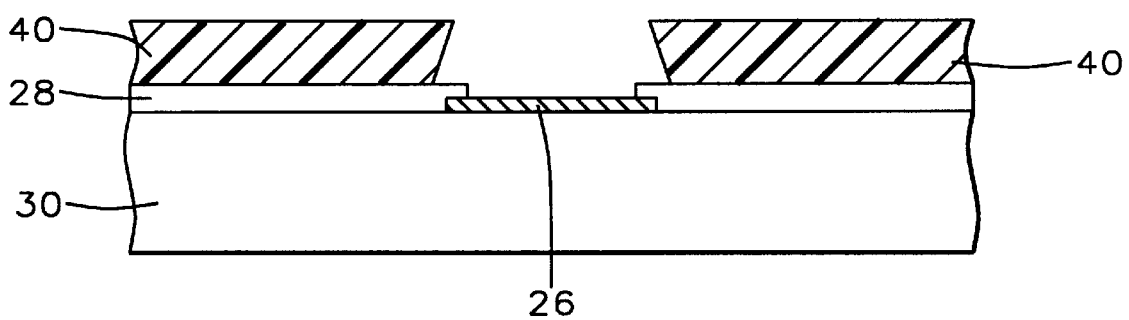
FIGS. 15 and 16 show cross sectional representations of the method of forming the polymer bodies on the input/output pads without base metal pads using a lift off method.
Figure 16:
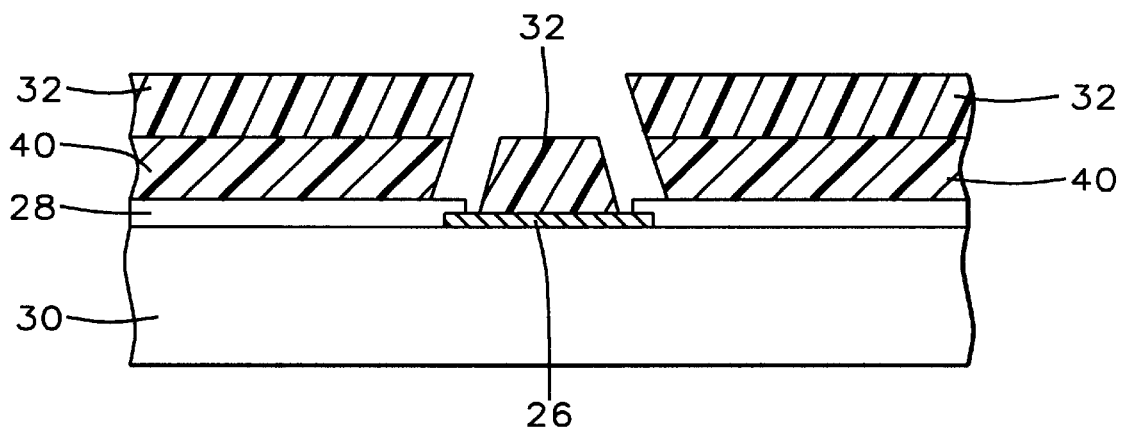

Another embodiment is shown in FIGS. 7A, 15, 16, and 7E–7H. First, as shown in FIG. 7A, a dielectric passivation layer 28 is formed on the integrated circuit element or substrate 30 with openings for the input/output pads 26. Next, as shown in FIG. 15, a photo resist mask 40 is formed leaving photoresist everywhere except over the input/output pads 26. Next a layer of polymer 32 is formed on the photoresist 40 and on the input/output pads 26, as shown in FIG. 16. As shown in FIG. 7E, the photoresist mask is then removed also removing the polymer layer on the photoresist mask and leaving a plurality of polymer bodies on the input/output pads 26. As shown in FIG. 7F, a conductive metal layer 36 is then deposited over the passivation layer 28 also covering the polymer bodies 32. A patterned layer of photoresist 40, FIG. 7G, is then formed on the conductive metal layer 36 and the conductive metal layer is etched to the pattern of the photoresist 40, FIG. 7H, leaving a conductive metal layer 36 on the polymer bodies 32. The photoresist is then stripped, FIG. 7I, and the composite bump is formed.

Figure 17:
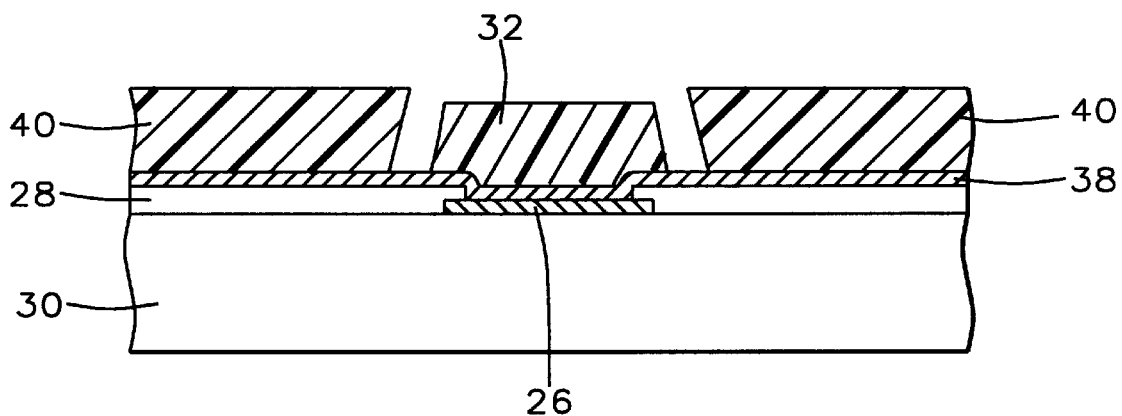
FIGS. 17, 18, and 19 show cross sectional representations of the method of forming the conductive metal layer on the polymer bodies over a base metal layer using a lift off method.
Figure 18:
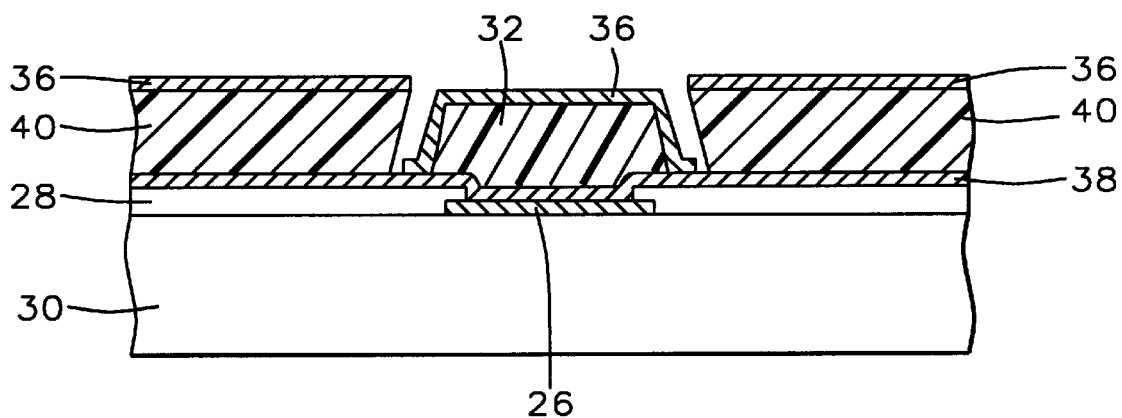
Figure 19:
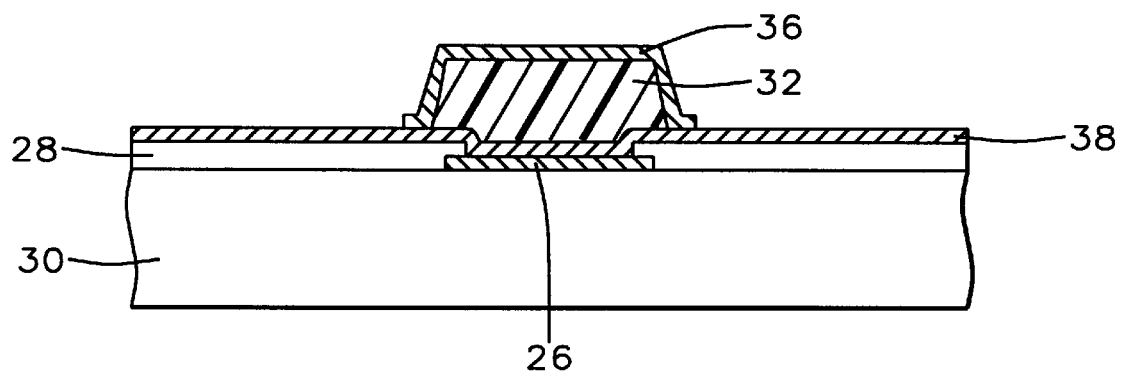
Figure 20:
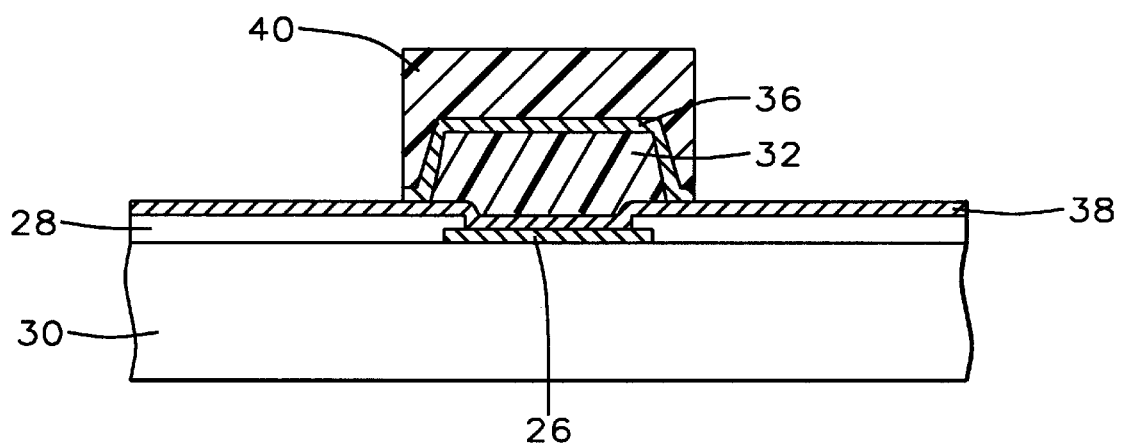
FIG. 20 shows a cross sectional representation of a photoresist mask over the composite bump when using an etching method to form the base metal pads.

Another embodiment is shown in FIGS. 8A–8F, 17, 18, 19, 20, and 8J. As shown in FIG. 8A and 8B a base metal layer 38 of a metal such as aluminum is deposited over the dielectric passivation layer 28 covering the input/output pads 26. Next, as shown in FIG. 8C, a layer of non photosensitive polymer 32 with a thickness of between about 5 and 25 microns is formed on the surface of the base metal layer 38. Next, as shown in FIG. 8D, a first photoresist mask 40 is formed on the polymer layer. As shown in FIG. 8E, the polymer layer then etched to the photoresist mask pattern forming a plurality of polymer bodies. The first photoresist mask is then removed, FIG. 8F. Next, as shown in FIG. 17, a second photoresist mask 40 having openings at the location of the polymer bodies 32 is formed over the base metal layer 38. As shown in FIG. 18 a conductive metal layer 36 is then formed on the second photoresist mask 40 and on the polymer body 32. As shown in FIG. 19 the second photoresist mask is then removed, removing that part of the conductive metal layer on the second photoresist mask and leaving the conductive metal layer on the polymer bodies. The composite bump is then formed. Next as shown in FIG. 20 a third photoresist mask 40 is formed over the composite bumps and the base metal layer is etched to the desired shape, FIG. 8J.

Another embodiment is shown in FIGS. 10A–10D, 17, 18, 19, 20, and 10H. As shown in FIGS. 10A and 10B a base metal layer 38 of a metal such as aluminum is deposited over the dielectric passivation layer 28 covering the input/output pads 26. Next, as shown in FIG. 10C, a layer of photosensitive polymer 32 with a thickness of between about 5 and 25 microns is formed on the surface of the base metal layer 38. Next, as shown in FIG. 10D, the photosensitive polymer is exposed and developed leaving a plurality of polymer bodies 32 on the base metal layer 38. In this example the polymer bodies are directly over the input/output pads 26 but this is not necessary as long as the base metal layer makes contact with the input/output pads. Next, as shown in FIG. 17, a first photoresist mask 40 having openings at the location of the polymer bodies 32 is formed over the base metal layer 38. As shown in FIG. 18 a conductive metal layer 36 is then formed on the first photoresist mask 40 and on the polymer body 32. As shown in FIG. 19 the first photoresist mask is then removed, removing that part of the conductive metal layer on the photoresist mask and leaving the conductive metal layer on the polymer bodies and the composite bumps are formed. Next, as shown in FIG. 20, a second photoresist mask 40 is formed over the composite bumps and the base metal layer is etched to the desired shape, FIG. 10H.

Figure 21:
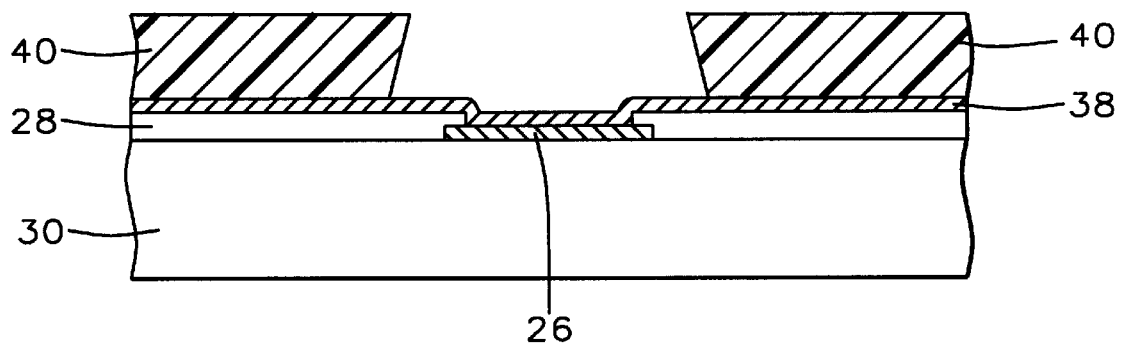
FIGS. 21 and 22 show cross sectional representations of the method of forming the polymer bodies on a base metal layer using a lift off method.
Figure 22:
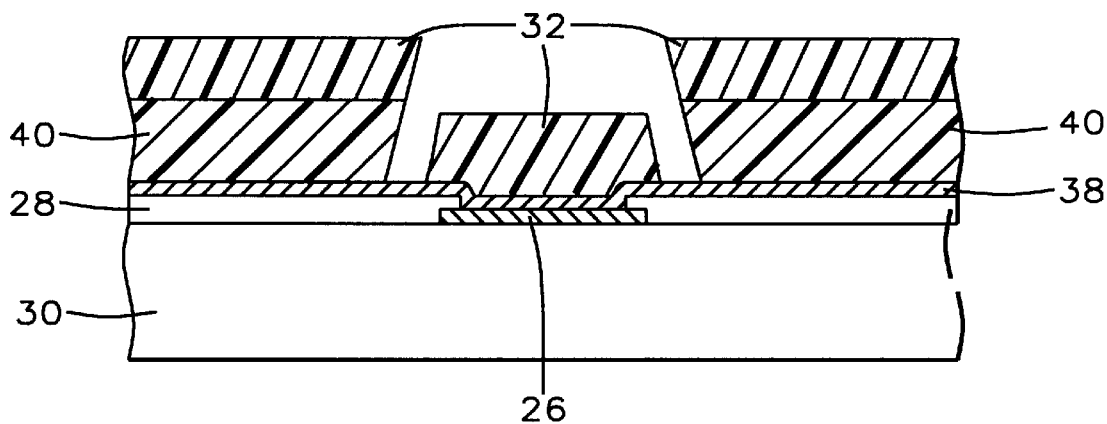

Refer now to FIGS. 10A, 10B, 21, 22, and 10D–10H, there is shown another embodiment of a method of forming composite bumps. As shown in FIGS. 10A and 10B a base metal layer 38 of a metal such as aluminum is deposited over the dielectric passivation layer 28 covering the input/output pads 26. Next, as shown in FIG. 21, a first photoresist mask having openings where composite bumps are desired is formed over the base metal layer 38. A polymer layer 32 is then formed on the top surface of the first photoresist mask 40 and on those areas of the base metal layer 38 not covered by the first photoresist mask, as shown in FIG. 22. Next, as shown in FIG. 10D, the first photoresist mask is removed, also removing that part of the polymer layer formed on the first photoresist mask, leaving polymer bodies formed on the base metal layer. A conductive metal layer 36 is then formed on the top surface of the base metal layer 38 covering the polymer bodies 32, FIG. 10E. A second photoresist mask 40 is then formed on the top surface of the conductive metal layer 36 at the locations of the polymer bodies 32, FIG. 10F. As shown in FIG. 10G, the conductive metal layer 36 and the base metal layer 38 are etched to the shape of the second photoresist mask 40 and the composite bumps are formed.

Figure 23:
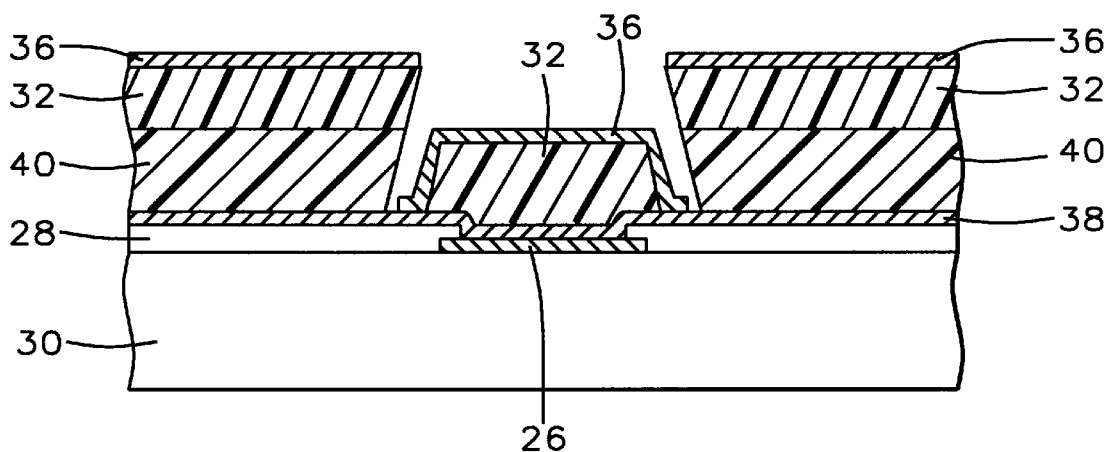
FIGS. 23 and 24 show cross sectional representations of the method of forming the polymer bodies on a base metal layer and the conductive metal layer on the polymer bodies using a lift off method.
Figure 24:
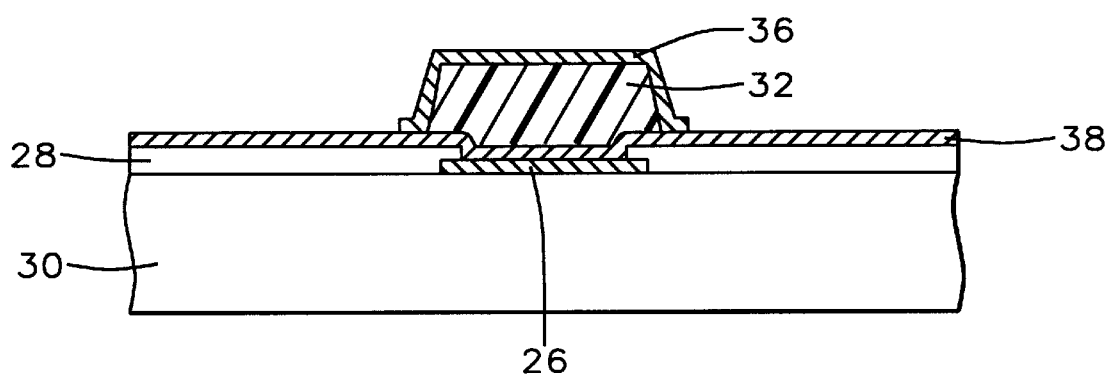
Figure 25:
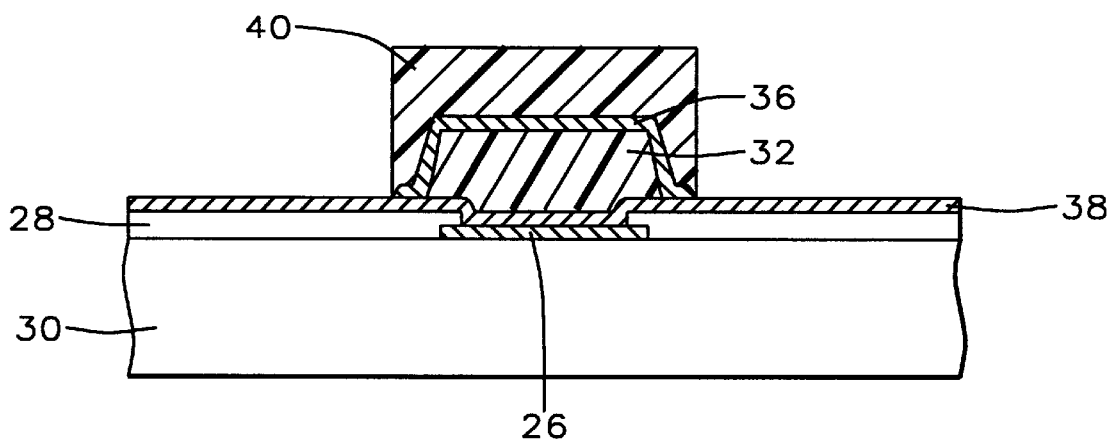
FIG. 25 shows a cross sectional representation of a photoresist mask over the composite bump when using an etching method to form the base metal pads.

Another embodiment of a method for forming composite bumps is shown in FIGS. 10A, 10B, 21, 22, 23, 24, 25, 10G, and 10H. As shown in FIGS. 10A, 10B, 21, and 22, this embodiment proceeds exactly as the preceding embodiment through the formation of the polymer layer 32 on the first photoresist mask 40 and that part of the base metal layer 38 not covered by the first photoresist mask. As shown in FIG. 23, a conductive metal layer 36 is then formed on the top surface of the polymer layer 32. The first photoresist mask 40 is then removed also removing those parts of the polymer layer and conductive metal layer over the first photoresist mask, FIG. 24, thereby forming composite bumps. A second photoresist mask 40 is then formed on the top surface of the base metal layer 38 at the locations of the composite bumps, FIG. 25. As shown in FIG. 10G, the base metal layer 38 is etched to the shape of the second photoresist mask 40. The second photoresist mask is then removed, FIG. 10H.

Figure 26:
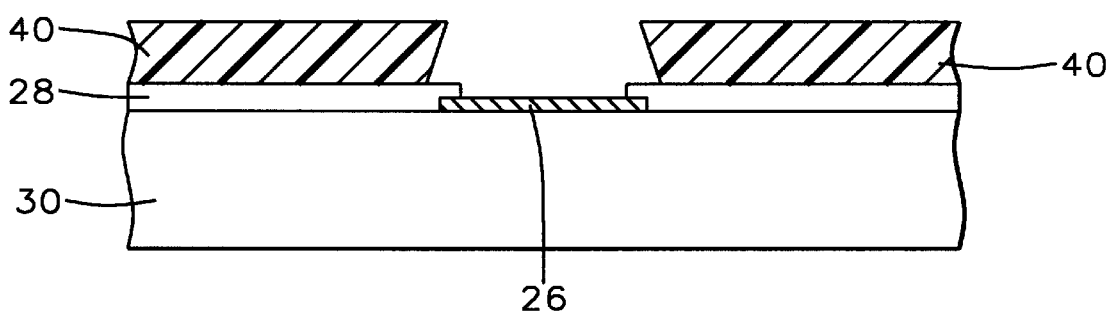
FIGS. 26, 27, and 28 show a cross sectional representation of a method of forming base metal pads using a lift off method.
Figure 27:
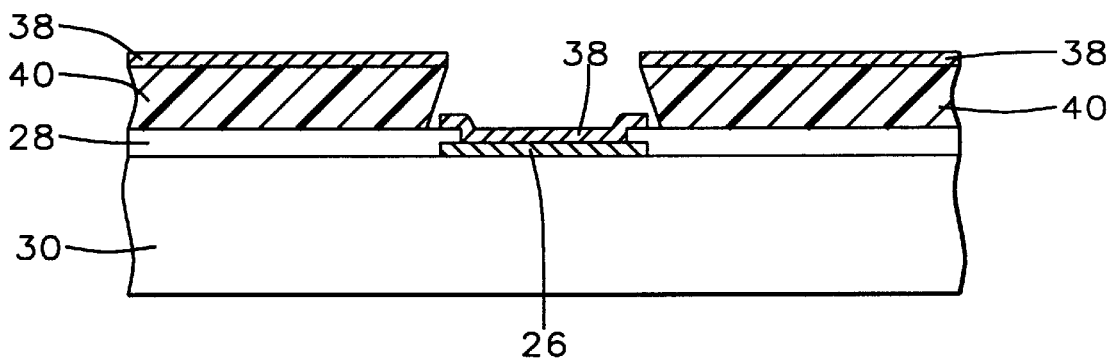
Figure 28:
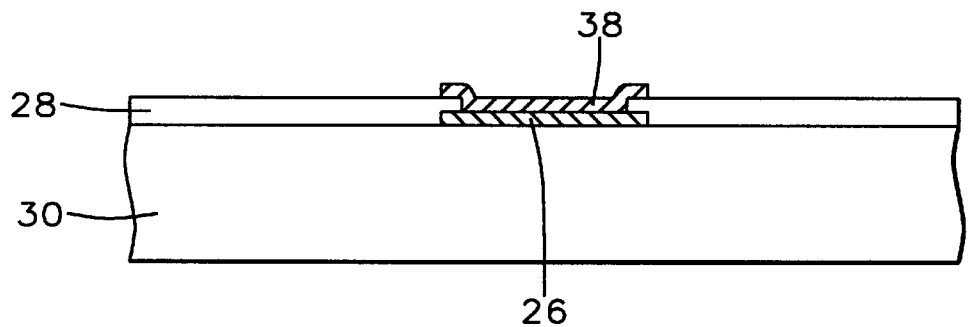
Figure 29:
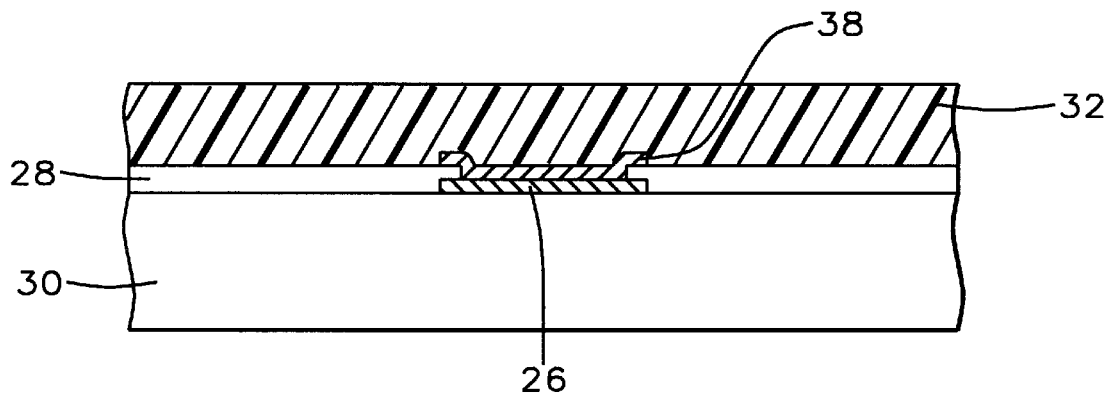
FIGS. 29 through 32 show a cross sectional method of forming polymer bodies on base metal pads using an etching method.
Figure 30:
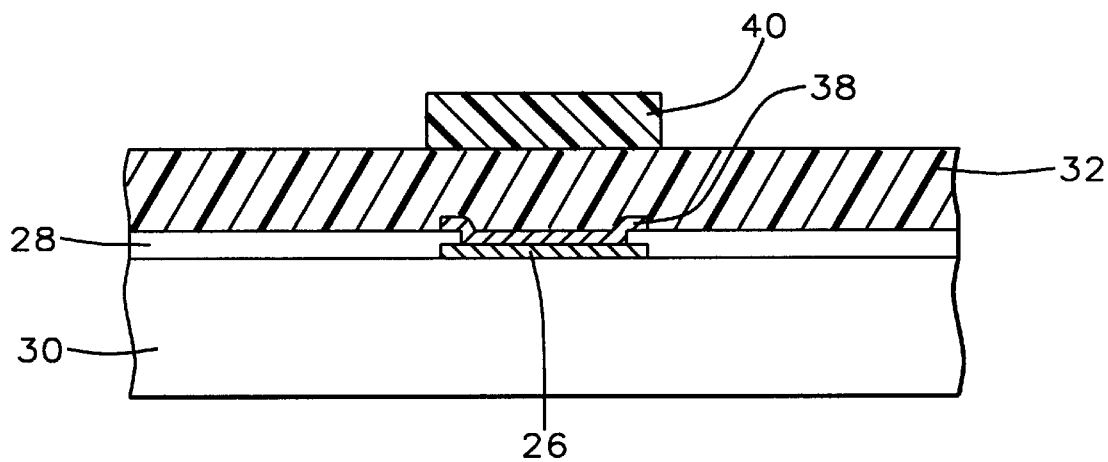
Figure 31:
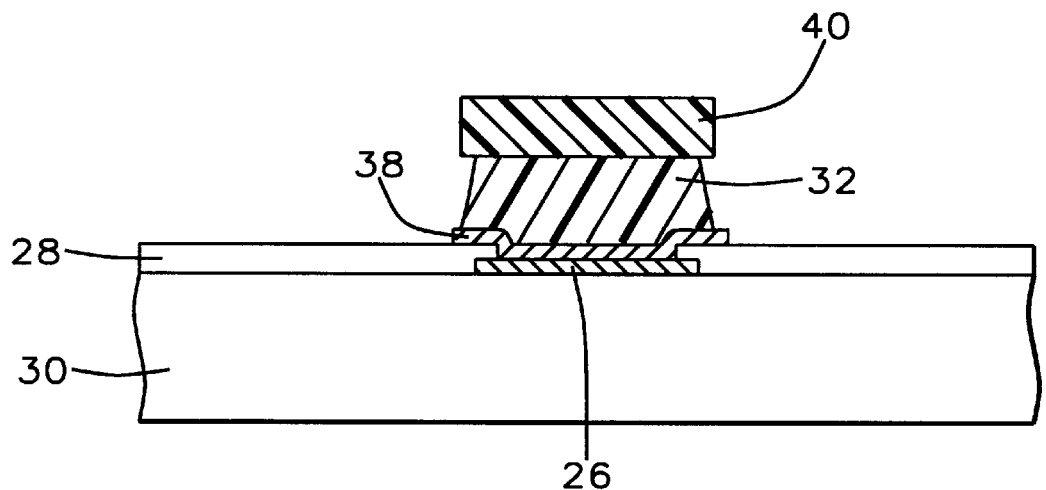
Figure 34:
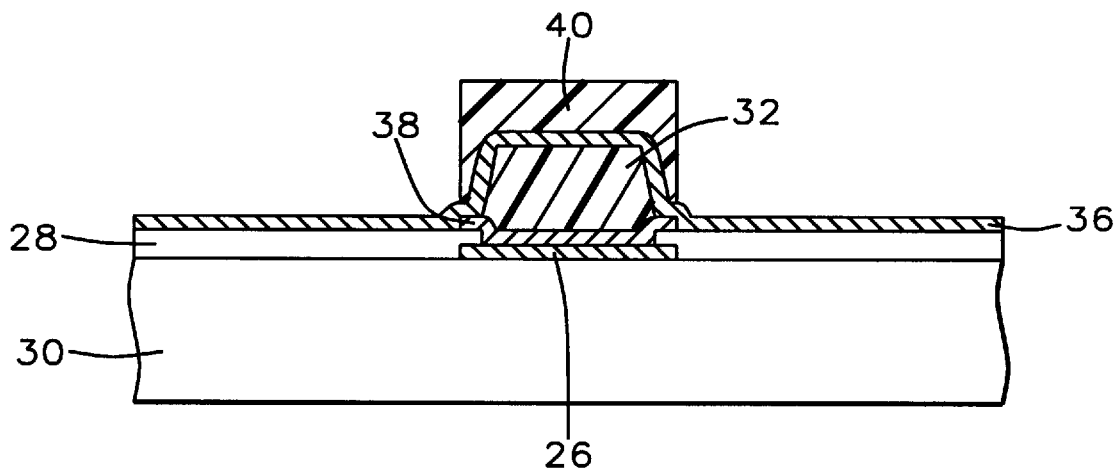
Figure 35:
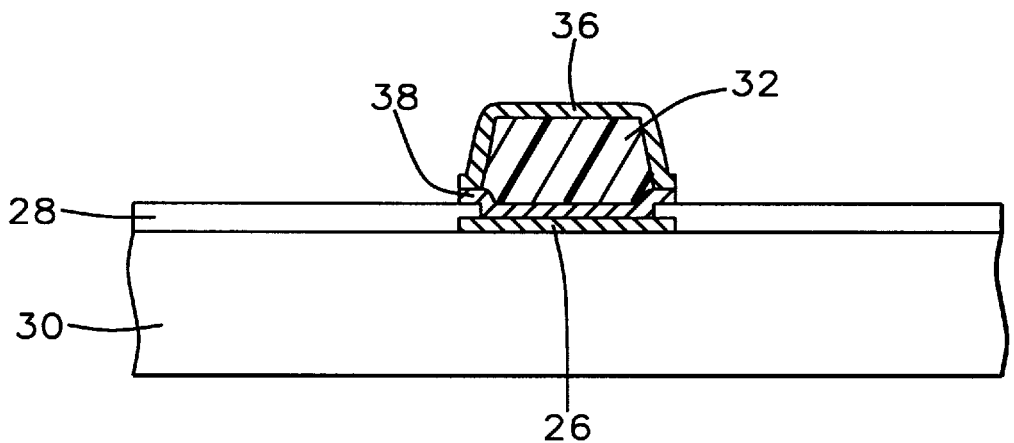

Another embodiment of a method of forming composite bumps is shown in FIGS. 7A and 26–35. First, as shown in FIG. 7A, a dielectric passivation layer 28 is formed on an integrated circuit element or substrate 30 with aluminum input/output pads 26 having a diameter of about 90 microns. The dielectric passivation layer has openings over the input/output pads. Next, as shown in FIG. 26, a first photoresist mask 40 having openings at the locations of the input/output pads 26 is formed on the top surface of the passivation layer. Next, as shown in FIG. 27, a base metal layer 38 is formed on the top surface of the first photoresist mask 40, the input/output pads 26, and those parts of the dielectric passivation layer 28 not covered by the first photoresist mask 40. The first photoresist mask is then removed, FIG. 28, also removing the base metal layer on the first photoresist mask leaving the base metal layer 38 on the input/output pads 26 and a part of the dielectric passivation layer 28, thereby forming base metal pads. Next, as shown in FIG. 29, a polymer layer 32 is formed on the top surface of the dielectric passivation layer 28 and the base metal pads 38. A second photoresist mask 40 is then formed on top surface of the polymer layer 32 over the base metal pads 38, FIG. 30. As shown in FIG. 31, that part of the polymer layer not covered by the second photoresist mask is etched away forming a plurality of polymer bodies 32 on the base metal pads 38. A conductive metal layer 36 is then formed on the dielectric layer 28, the polymer bodies 32, and that part of the base metal pads 38 not covered by the polymer bodies, FIG. 33. As shown in FIG. 34, a third photoresist mask 40 is formed on the top surface of the conductive metal layer at the locations of the polymer bodies. As shown in FIG. 35, that part of the conductive metal layer not covered by the third photoresist mask is etched away and the third photoresist mask is then removed, leaving a conductive metal layer on the polymer bodies thereby forming composite bumps.

Figure 36:
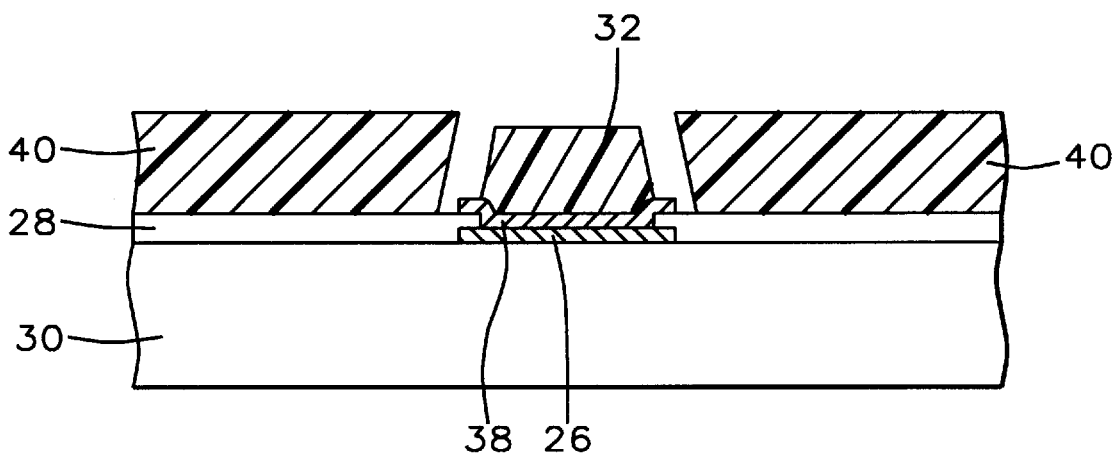
FIGS. 36 and 37 show a cross sectional representation of a method of forming a conductive metal layer on polymer bodies formed on base metal pads using a lift off method.
Figure 37:
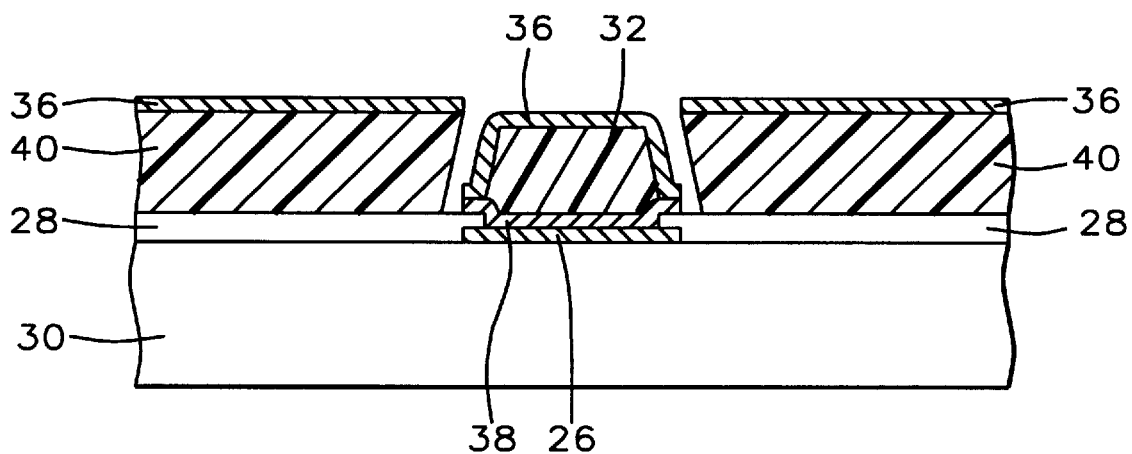

Another embodiment of a method of forming composite bumps is shown in FIGS. 7A, 26–32, and 35–37. This embodiment proceeds exactly like the preceding embodiment through the formation of the polymer bodies 32, see FIG. 32. As shown in FIG. 36, a second photoresist mask having openings at the locations of the polymer bodies is then formed on the top surface of the dielectric insulating layer 28. As shown in FIG. 37, a conductive metal layer 36 is formed on the top surface of the second photoresist mask 40 and the polymer bodies. As shown in FIG. 35, the second photoresist mask is then removed, also removing that part of the conductive metal layer on the second photoresist mask and leaving the conductive metal layer on the polymer bodies thereby forming the composite bumps.

Figure 38:
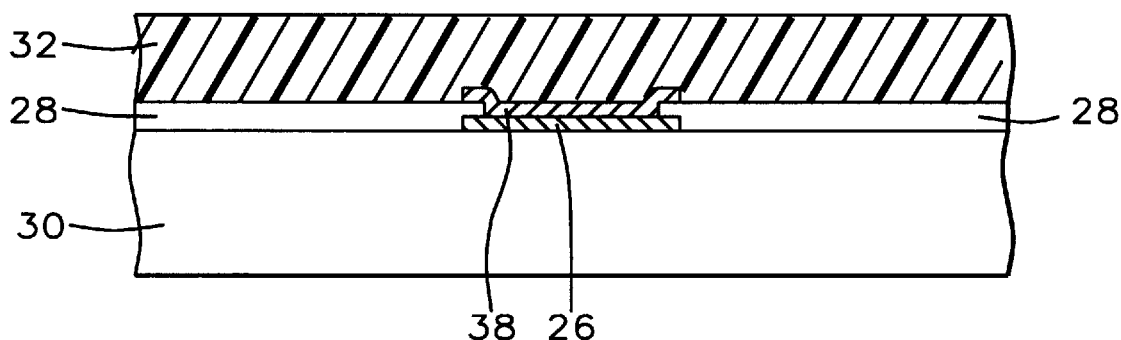
FIGS. 38 and 39 show a cross sectional representation of a method of forming polymer bodies on base metal pads using photosensitive polymer.
Figure 39:
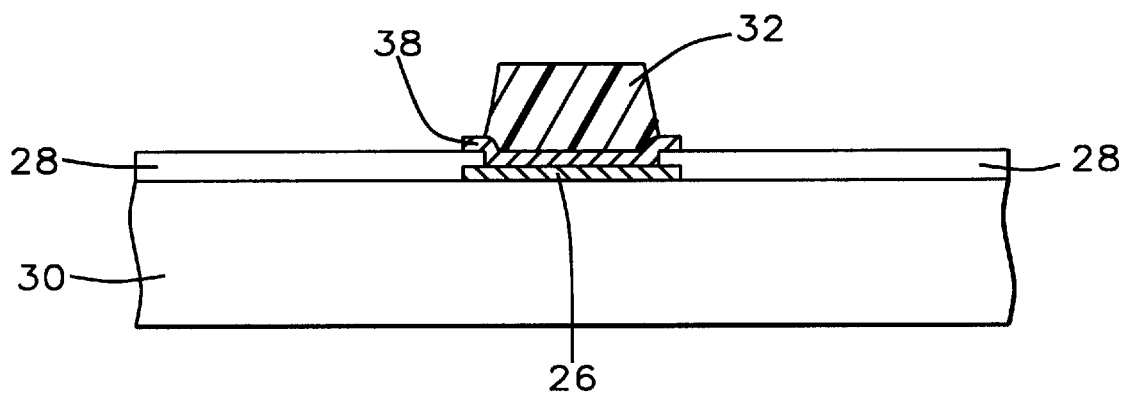

Another embodiment is shown in FIGS. 7A, 26–28, 33–35, 38 and 39. This embodiment proceeds like the two preceding embodiments through the formation of the base metal pads 38, FIG. 28. Next, as shown in FIG. 38, a photosensitive polymer layer 32 is formed on the top surface of the dielectric passivation layer 28 and the base metal pads 38. As shown in FIG. 39, the photosensitive polymer layer is then exposed and developed leaving a plurality of polymer bodies 32 over the base metal pads 38. A conductive metal layer 36 is then formed on the dielectric layer 28, the polymer bodies 32, and that part of the base metal pads 38 not covered by the polymer bodies, FIG. 33. As shown in FIG. 34, a second photoresist mask 40 is formed on the top surface of the conductive metal layer at the locations of the polymer bodies. As shown in FIG. 35, that part of the conductive metal layer not covered by the second photoresist mask is etched away and the third photoresist mask is then removed, leaving a conductive metal layer on the polymer bodies thereby forming composite bumps.

Another embodiment is shown in FIGS. 7A, 26–28, and 35–39. This embodiment proceeds exactly like the preceding embodiment through the formation of the polymer bodies 32, FIG. 39. As shown in FIG. 36, a second photoresist mask having openings at the locations of the polymer bodies is then formed on the top surface of the dielectric insulating layer 28. As shown in FIG. 37, a conductive metal layer 36 is formed on the top surface of the second photoresist mask 40 and the polymer bodies. As shown in FIG. 35, the second photoresist mask is then removed, also removing that part of the conductive metal layer on the second photoresist mask and leaving the conductive metal layer on the polymer bodies thereby forming the composite bumps.

Figure 32:
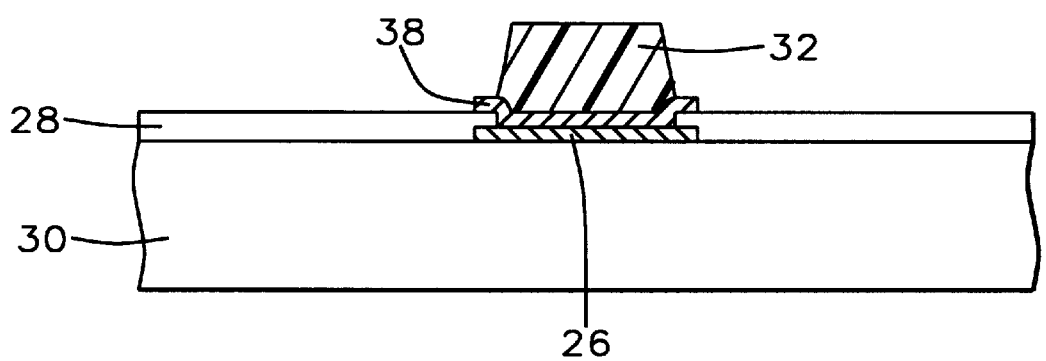
Figure 33:
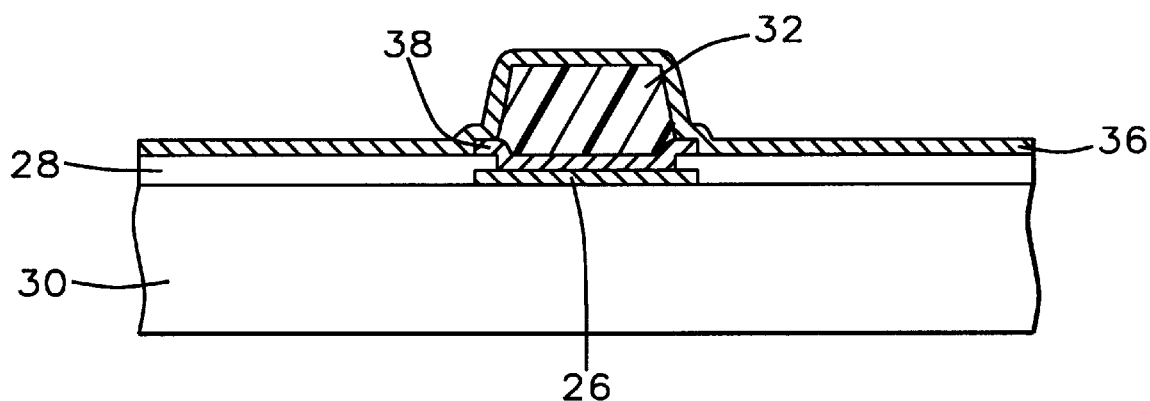
FIGS. 33 through 35 show a cross sectional representation of a method of forming a conductive metal layer on polymer bodies formed on base metal pads using an etching method.
Figure 40:
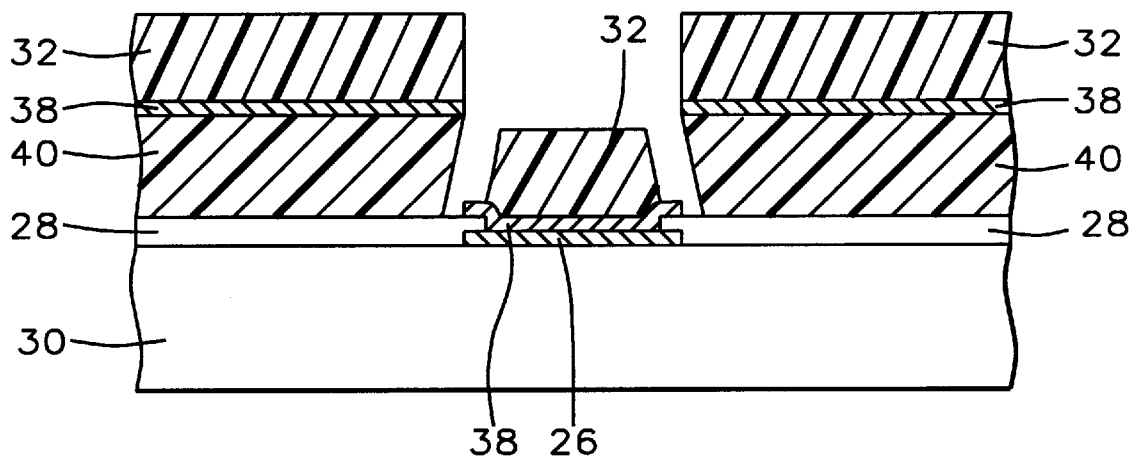
FIGS. 40 and 41 show a cross sectional representation of a method of forming the composite bumps on base metal pads using a lift off method.
Figure 41:
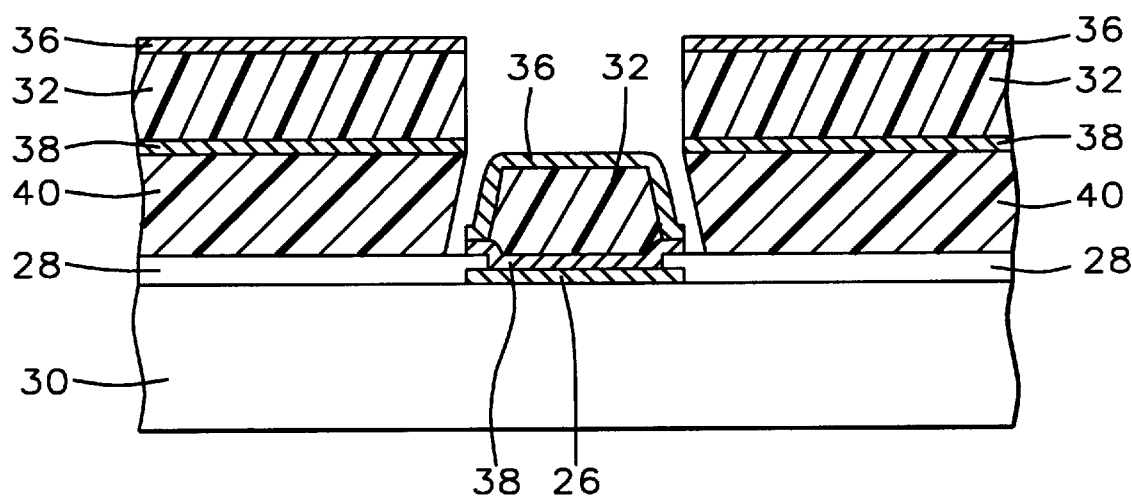

Another embodiment of a method of forming composite bumps is shown in FIGS. 7A, 26, 27, 32–35, and 40. First, as shown in FIG. 7A, a dielectric passivation layer 28 is formed on an integrated circuit element or substrate 30 with aluminum input/output pads 26 having a diameter of about 90 microns. The dielectric passivation layer has openings over the input/output pads. Next, as shown in FIG. 26, a first photoresist mask 40 having openings at the locations of the input/output pads 26 is formed on the top surface of the passivation layer. Next, as shown in FIG. 27, a base metal layer 38 is formed on the top surface of the first photoresist mask 40, the input/output pads 26, and those parts of the dielectric passivation layer 28 not covered by the first photoresist mask 40. Next, as shown in FIG. 40, a polymer layer 32 is formed on the top surface of the base metal layer. Next, as shown in FIG. 32, the first photoresist mask is removed, also removing those parts of the base metal layer and polymer layer on the first photoresist mask leaving a plurality of polymer bodies 32 formed on base metal pads 26. As shown in FIG. 32, A conductive metal layer 36 is then formed on the dielectric layer 28, the polymer bodies 32, and that part of the base metal pads 38 not covered by the polymer bodies. As shown in FIG. 34, a second photoresist mask 40 is formed on the top surface of the conductive metal layer at the locations of the polymer bodies. As shown in FIG. 35, that part of the conductive metal layer not covered by the second photoresist mask is etched away and the third photoresist mask is then removed, leaving a conductive metal layer on the polymer bodies thereby forming composite bumps.

Another embodiment of a method of forming composite bumps is shown in FIGS. 7A, 26, 27, 40, and 41. First, as shown in FIG. 7A, a dielectric passivation layer 28 is formed on an integrated circuit element or substrate 30 with aluminum input/output pads 26 having a diameter of about 90 microns. The dielectric passivation layer has openings over the input/output pads. Next, as shown in FIG. 26, a first photoresist mask 40 having openings at the locations of the input/output pads 26 is formed on the top surface of the passivation layer. Next, as shown in FIG. 27, a base metal layer 38 is formed on the top surface of the first photoresist mask 40, the input/output pads 26, and those parts of the dielectric passivation layer 28 not covered by the first photoresist mask 40. Next, as shown in FIG. 40, a polymer layer 32 is formed on the top surface of the base metal layer. Next as, shown in FIG. 41, a conductive metal layer 36 is formed on the top surface of the polymer layer 32. Next, as shown in FIG. 35, the photoresist mask is removed also removing the base metal layer, polymer layer, and conductive metal layer on the photoresist mask. After removal of the photoresist mask, polymer bodies with a conductive metal layer over them are left on the base metal pads and the composite bumps are formed.

FIG. 8J shows an embodiment of the composite bump structure formed on either an integrated circuit element or on a substrate. An input/output pad 26, formed of a metal such as aluminum, of about 90 microns diameter is formed on an integrated circuit element or substrate 30. A passivation layer 28 is formed on the integrated circuit element or substrate 30 covering the input/output pads 26 and having contact hole openings directly over the input/output pads. A base metal pad 38, of a metal such as aluminum, is then formed on the passivation layer 28 covering the input/output pads 26 and forming electrical contact with the input/output pads. A polymer body 32 with a thickness of between about 5 microns and 25 microns is formed on the base metal pads 38 and a conductive metal coating 36 is formed over the polymer body 32 making electrical contact with the base metal pads 38.

Figure 43:
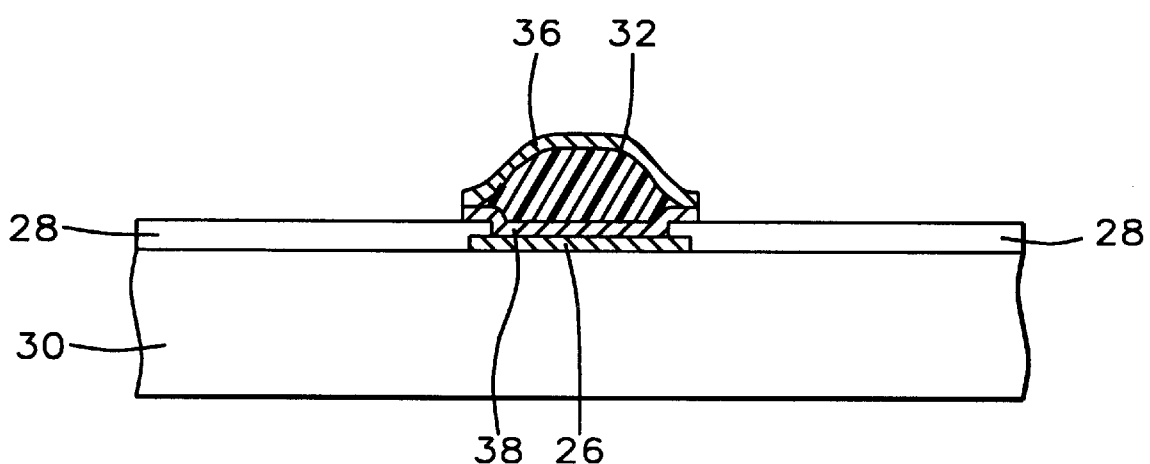
FIG. 43 shows a cross sectional representation of composite blimps having a rounded shape.
Figure 44:
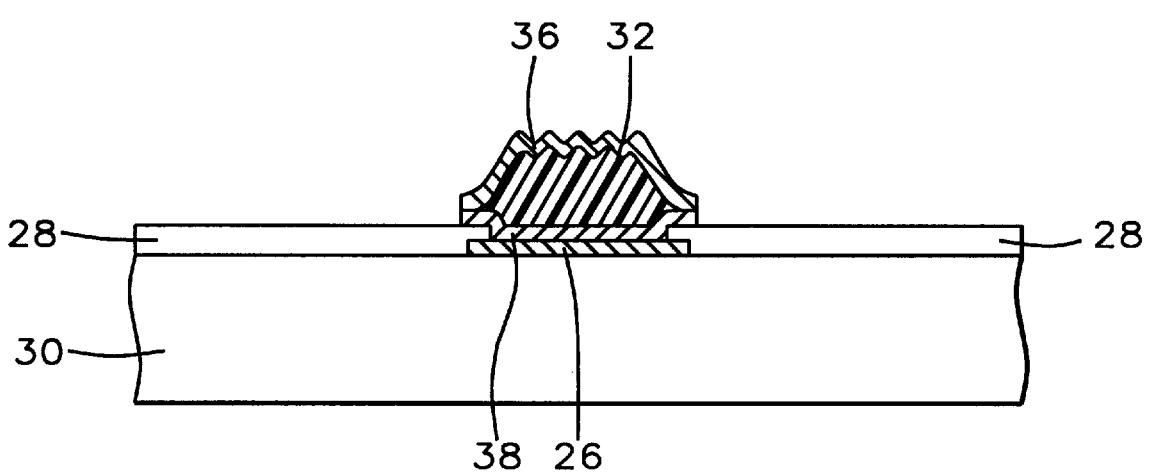
FIG. 44 shows a cross sectional representation of composite blimps having a rough exterior.

The conductive metal coating can be a composite of chrome and gold with about 500 Angstroms chrome and 2000 Angstroms gold. The conductive metal coating 36 must adhere to the polymer body and be formed of metals or metal composites described in previous embodiments. The composite can have a rounded shape as shown in FIG. 43. As shown in FIG. 44, the composite bump can also have a rough exterior 62 on the surface of the composite bump opposite the base metal pad 38.

Figure 42:
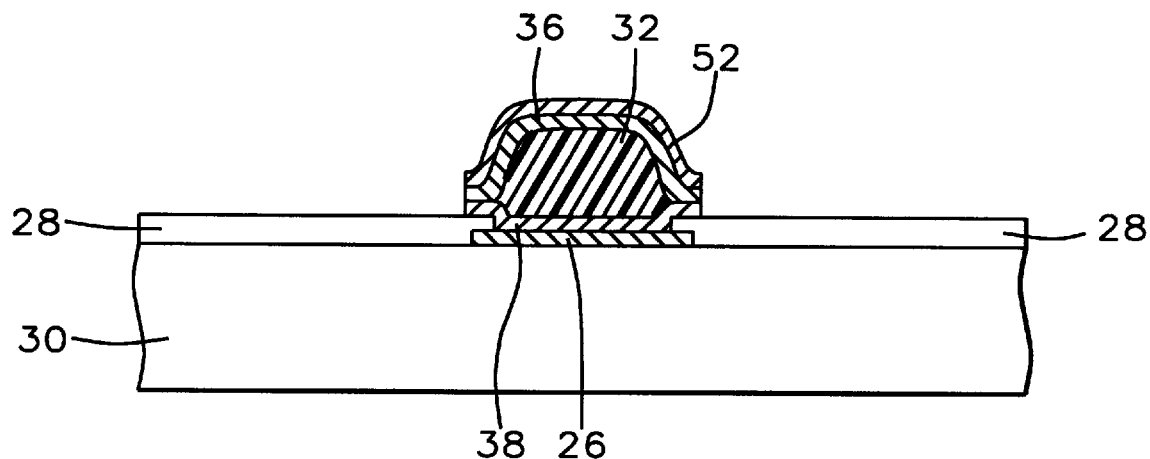
FIG. 42 shows a cross sectional representation of composite bumps having soldering metal covering the conductive metal coating.

Refer now to FIG. 42, there is shown an embodiment of a composite bump structure formed on an integrated circuit element or substrate 30. The composite bump structure in this embodiment has an integrated circuit element or substrate 30 with input/out pads 26, a passivation layer 28, base metal pads 38, and a polymer body 32 covered by a conductive metal coating 36 exactly as described in the previous embodiment. In this embodiment the conductive metal coating 36 is covered by a layer of soldering metal 52, such as lead/tin.

While the invention has been particularly shown and described with reference to the preferred embodiments thereof, it will be understood by those skilled in the art that various changes in form and details may be made without departing from the spirit and scope of the invention.

What is claimed is:

1. A composite bump structure, comprising:
   an integrated circuit element;
   input/output pads formed on said integrated circuit element, wherein each of said input/output pads has an outer perimeter;
   base metal pads formed on said input/output pads; and
   composite bumps formed on said base metal pads, wherein said composite bumps comprise a polymer body covered by a conductive metal coating, wherein said polymer body has a Young's Modulus between about $0.4 \times 10^{-6}$ and $0.5 \times 10^{-6}$ psi.

2. The composite bump structure of claim 1 wherein said polymer body is polyamic acid polyimide.

3. The composite bump structure of claim 1 wherein a base metal is formed under said composite bumps and on top of said input/output pads.

4. The composite bump structure of claim 1 wherein said base metal pads are aluminum.

5. The composite bump structure of claim 1 wherein said conductive metal coating is coated with solder.

6. The composite bump structure of claim 5 wherein said solder is 95% lead and 5% tin.

7. The composite bump structure of claim 1 wherein said composite bumps extend beyond said outer perimeter of each of said input/output pads.

8. The composite bump structure of claim 1 wherein said composite bumps are in a ring around said input/output pads.

9. A composite bump structure, comprising:
   an integrated circuit element with input/output pads;
   a passivation layer covering said integrated circuit element having contact holes over said input/output pads;
   base metal pads formed on said passivation layer covering said contact holes and making electrical contact with said input/output pads; and
   composite bumps formed on said base metal pads, wherein said composite bumps comprise a polymer body covered by a conductive metal coating, wherein said polymer body has a Young's Modulus between about $0.4 \times 10^{-6}$ and $0.5 \times 10^{-6}$ psi.

10. The composite bump structure of claim 9 wherein said composite bumps have a rounded shape.

11. The composite bump structure of claim 9 wherein that part of the surface of said composite bumps opposite said base metal pads is flat.

12. The composite bump structure of claim 9 wherein that part of the surface of said composite bumps opposite said base metal pads has a rough, irregular exterior.

13. The composite bump structure of claim 9 wherein said base metal is aluminum.

14. The composite bump structure of claim 9 wherein said polymer body, is polyamic acid polyimide.

15. The composite bump structure of claim 9 wherein said polymer body, is photosensitive polymer.

16. The composite bump structure of claim 15 wherein said photosensitive polymer is photosensitive polyamic acid polyimide.

17. The composite bump structure of claim 9 wherein said conductive metal coating is covered by a layer of soldering metal.

18. The composite bump structure of claim 17 wherein said layer of soldering metal is 95% lead and 5% tin.

19. A composite bump structure, comprising:

an integrated circuit element;

input/output pads formed on said integrated circuit element, wherein each of said input/output pads has an outer periphery; and multiple composite bumps formed wherein each said composite bump is formed from a polymer body having a Young's Modulus between about $0.4 \times 10^{-6}$ and $0.5 \times 10^{-6}$ psi covered by a conductive metal coating and said multiple composite bumps are located inside said outer periphery of each said input/output pad.

20. A composite bump structure, comprising:

an integrated circuit element;

input/output pads formed on said integrated circuit element, wherein each of said input/output pads has an outer periphery; and multiple composite bumps formed wherein each said composite bump is formed from a polymer body having a Young's Modulus between about $0.4 \times 10^{-6}$ and $0.5 \times 10^{-6}$ psi covered by a conductive metal coating and said multiple composite bumps are located in a ring surrounding said outer periphery of each said input/output pad.

21. A composite bump structure, comprising:

an integrated circuit element;

input/output pads formed on said integrated circuit element, wherein each of said input/output pads has an outer periphery; and multiple composite bumps formed wherein each said composite bump is formed from a polymer body having a Young's Modulus between about $0.4 \times 10^{-6}$ and $0.5 \times 10^{-6}$ psi covered by a conductive metal coating and said multiple composite bumps are located inside said outer periphery of each said input/output pad and in a ring surrounding said outer periphery of each said input/output pad.

* * * * *

UNITED STATES PATENT AND TRADEMARK OFFICE
CERTIFICATE OF CORRECTION

PATENT NO. : 6,084,301 Page 1 of 1
APPLICATION NO. : 08/950376
DATED : July 4, 2000
INVENTOR(S) : Shyh-Ming Chang, Yu-Chi Lee and Jwo-Huei Jou It is certified that error appears in the above-identified patent and that said Letters Patent is hereby corrected as shown below:

In the patent application in column 12, line 25, delete "$0.4 \times 10^{-6}$ and $0.5 \times 10^{-6}$" and replace with --$0.4 \times 10^{6}$ and $0.5 \times 10^{6}$--.

In the patent application in column 12, line 53, delete "$0.4 \times 10^{-6}$ and $0.5 \times 10^{-6}$" and replace with --$0.4 \times 10^{6}$ and $0.5 \times 10^{6}$--.

In the patent application in column 13, lines 16 and 17, delete "$0.4 \times 10^{-6}$ and $0.5 \times 10^{-6}$" and replace with --$0.4 \times 10^{6}$ and $0.5 \times 10^{6}$--.

In the patent application in column14, lines 3 and 4, delete "$0.4 \times 10^{-6}$ and $0.5 \times 10^{-6}$" and replace with --$0.4 \times 10^{6}$ and $0.5 \times 10^{6}$--.

In the patent application in column 14, lines 15 and 16, delete "$0.4 \times 10^{-6}$ and $0.5 \times 10^{-6}$" and replace with --$0.4 \times 10^{6}$ and $0.5 \times 10^{6}$--.

Signed and Sealed this

Twenty-ninth Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,084,301 | Page 1 of 1 |
| APPLICATION NO. | : 08/950376 | |
| DATED | : July 4, 2000 | |
| INVENTOR(S) | : Shyh-Ming Chang, Yu-Chi Lee and Jwo-Huei Jou | |

It is certified that error appears in the above-identified patent and that said Letters Patent is hereby corrected as shown below:

On the Title page, item (73), delete "Industrial Technology Industrial Research, Hsin-Chu, Taiwan", and replace with -- Industrial Technology Research Institue, Hsin-Chu, Taiwan --.

Signed and Sealed this

First Day of April, 2008

JON W. DUDAS
*Director of the United States Patent and Trademark Office*